United States Patent
Takahashi et al.

(10) Patent No.: US 9,502,470 B2
(45) Date of Patent: Nov. 22, 2016

(54) SEMICONDUCTOR MEMORY DEVICE AND METHOD FOR MANUFACTURING SAME

(71) Applicant: KABUSHIKI KAISHA TOSHIBA, Tokyo (JP)

(72) Inventors: Atsushi Takahashi, Mie (JP); Toshiyuki Sasaki, Mie (JP); Tsubasa Imamura, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/642,911

(22) Filed: Mar. 10, 2015

(65) Prior Publication Data

US 2016/0035792 A1 Feb. 4, 2016

(30) Foreign Application Priority Data

Aug. 4, 2014 (JP) ................................ 2014-158941

(51) Int. Cl.

| | |
|---|---|
| *H01L 27/24* | (2006.01) |
| *H01L 21/311* | (2006.01) |
| *H01L 21/3065* | (2006.01) |
| *H01L 21/308* | (2006.01) |
| *H01L 45/00* | (2006.01) |
| *H01L 21/28* | (2006.01) |
| *H01L 27/115* | (2006.01) |

(52) U.S. Cl.
CPC ..... *H01L 27/2481* (2013.01); *H01L 21/28282* (2013.01); *H01L 21/308* (2013.01); *H01L 21/3065* (2013.01); *H01L 21/31111* (2013.01); *H01L 27/1157* (2013.01); *H01L 27/11582* (2013.01); *H01L 27/2436* (2013.01); *H01L 45/1675* (2013.01)

(58) Field of Classification Search
CPC ............. H01L 27/0688; H01L 27/108; H01L 27/10802; H01L 27/10891; H01L 27/1128; H01L 27/2481; H01L 27/249; H01L 29/685; H01L 29/788; H01L 29/7889; H01L 29/792; H01L 29/7926

See application file for complete search history.

(56) References Cited

U.S. PATENT DOCUMENTS

| | | |
|---|---|---|
| 7,936,004 B2 | 5/2011 | Kito et al. |
| 7,952,136 B2 | 5/2011 | Kito et al. |
| 8,237,211 B2 | 8/2012 | Fukuzumi et al. |

(Continued)

FOREIGN PATENT DOCUMENTS

| | | |
|---|---|---|
| JP | 2012-069583 | 4/2012 |
| JP | 2013-110193 | 6/2013 |

OTHER PUBLICATIONS

Shigeki Takahashi, et al., "Direct creation of three-dimensional photonic crystals by a top-down approach", *Nature Materials*, vol. 8, Sep. 2009, pp. 721-725.

*Primary Examiner* — Eduardo A Rodela
(74) *Attorney, Agent, or Firm* — Finnegan, Henderson, Farabrow, Garrett & Dunner LLP

(57) ABSTRACT

According to one embodiment, a semiconductor memory device includes a substrate including a major surface; a plurality of first films having conductivity or semiconductivity, the first films being provided above the substrate and extending in a first direction inclined with respect to the major surface; a plurality of second films having conductivity, the second films being provided above the substrate and extending in a second direction inclined with respect to the major surface and crossing the first direction; and a plurality of storage films provided in crossing sections of the first films and the second films.

11 Claims, 28 Drawing Sheets

(56) References Cited

U.S. PATENT DOCUMENTS

| | | |
|---|---|---|
| 8,284,601 B2 | 10/2012 | Son et al. |
| 8,551,838 B2 | 10/2013 | Kito et al. |
| 8,575,681 B2 | 11/2013 | Matsuda et al. |
| 2003/0185033 A1* | 10/2003 | Fricke .................... G11C 5/063 365/63 |
| 2007/0252201 A1 | 11/2007 | Kito et al. |
| 2011/0151673 A1 | 6/2011 | Noda et al. |
| 2011/0284947 A1 | 11/2011 | Kito et al. |
| 2011/0287597 A1 | 11/2011 | Kito et al. |
| 2012/0018796 A1* | 1/2012 | Yahashi ............ H01L 27/11573 257/324 |
| 2012/0248399 A1* | 10/2012 | Sasago ................ H01L 27/2409 257/4 |
| 2012/0300527 A1* | 11/2012 | Shim ...................... G11O 5/147 365/51 |

* cited by examiner

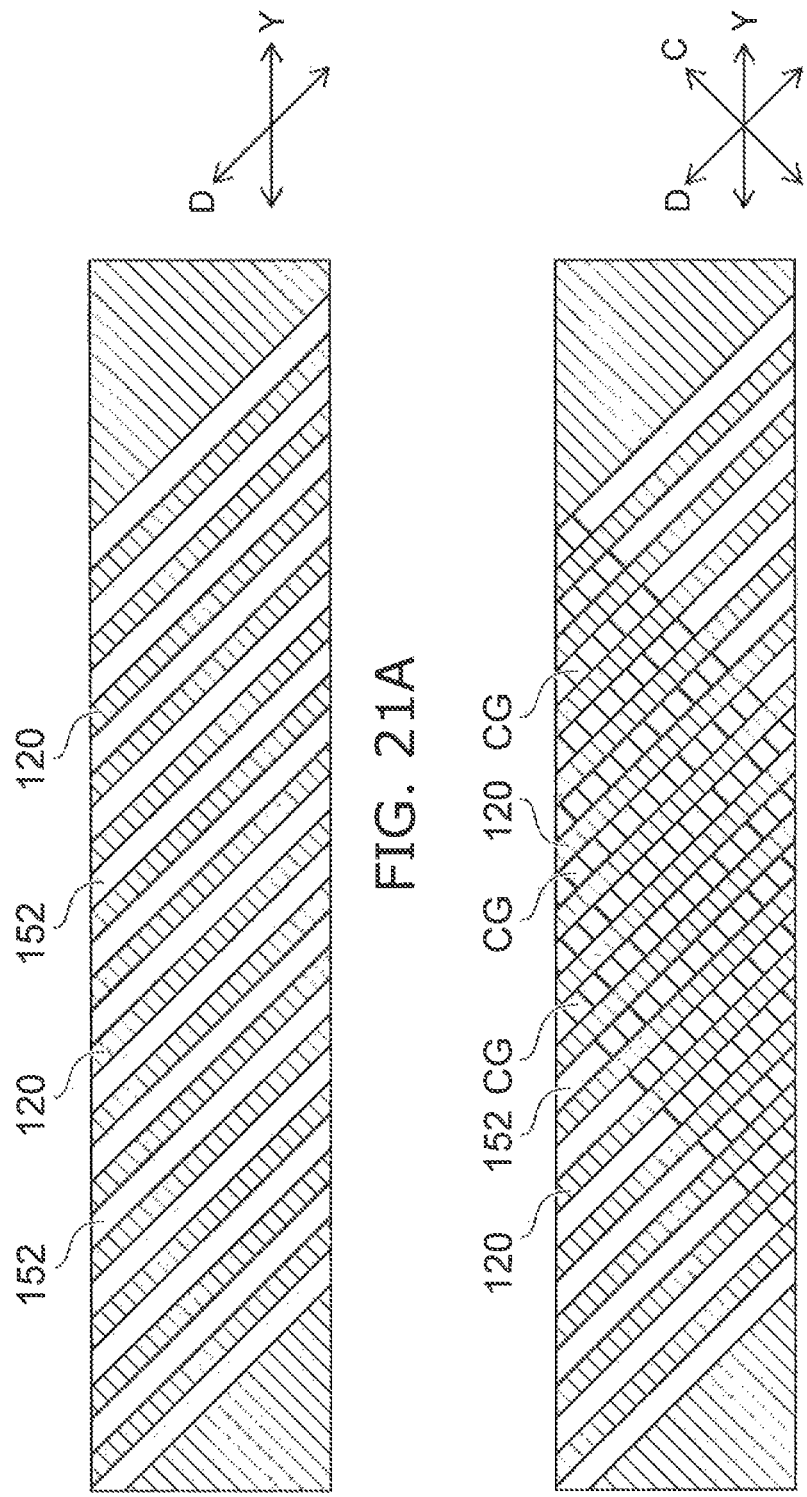

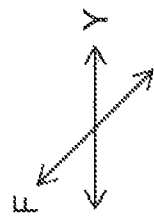
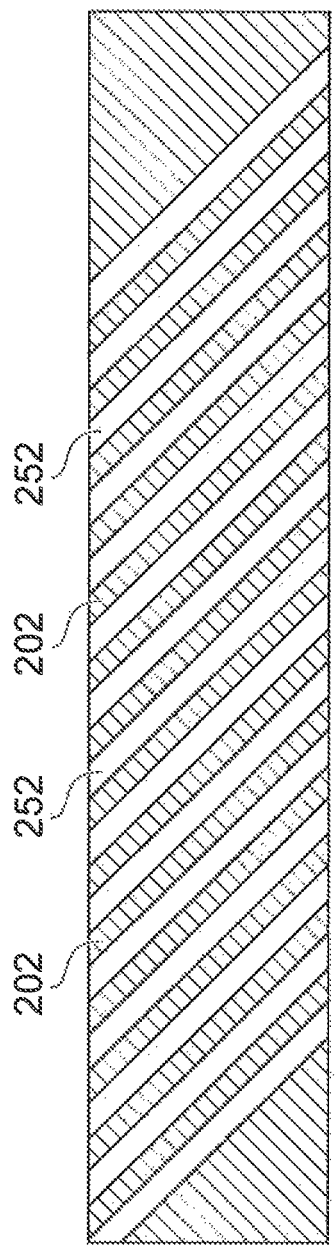
FIG. 29A
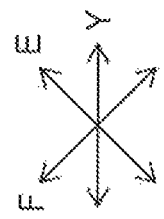
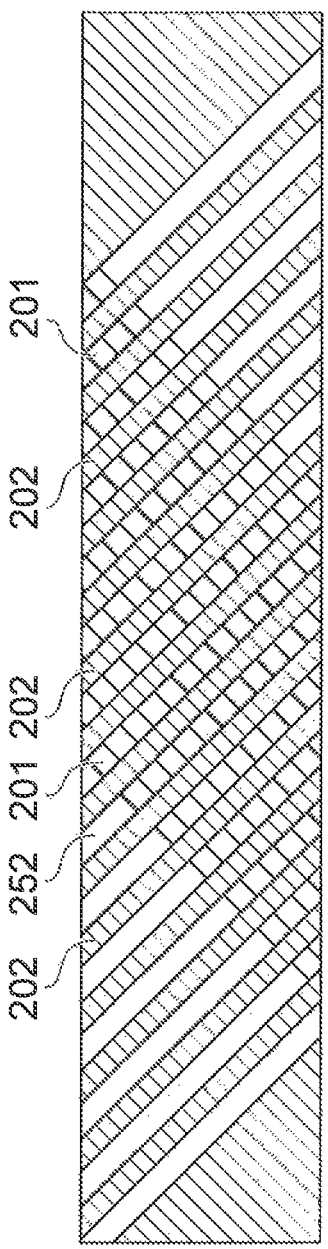
FIG. 29B

SEMICONDUCTOR MEMORY DEVICE AND METHOD FOR MANUFACTURING SAME

CROSS-REFERENCE TO RELATED APPLICATION

This application is based upon and claims the benefit of priority from Japanese Patent Application No. 2014-158941, filed on Aug. 4, 2014; the entire contents of which are incorporated herein by reference.

FIELD

Embodiments described herein relate generally to a semiconductor memory device and a method for manufacturing the same.

BACKGROUND

There has been proposed a memory device of a three-dimensional structure in which a memory hole is formed in a stacked body, in which a plurality of electrode films functioning as control gates in memory cells are stacked via insulating films, and a silicon body functioning as a channel is provided on the sidewall of the memory hole via a charge storage film.

In forming such a memory device of the three-dimensional structure, there has been proposed a method for repeating a process for alternately forming electrode films and insulating films on a substrate. However, the number of processes increases according to an increase in the number of stacked layers of the electrode films.

BRIEF DESCRIPTION OF THE DRAWINGS

FIGS. 13 to 21B are schematic views showing a method for manufacturing the semiconductor memory device of the second embodiment;

FIGS. 24 to 29B are schematic views showing a method for manufacturing the semiconductor memory device of the third embodiment.

DETAILED DESCRIPTION

Figure 1:
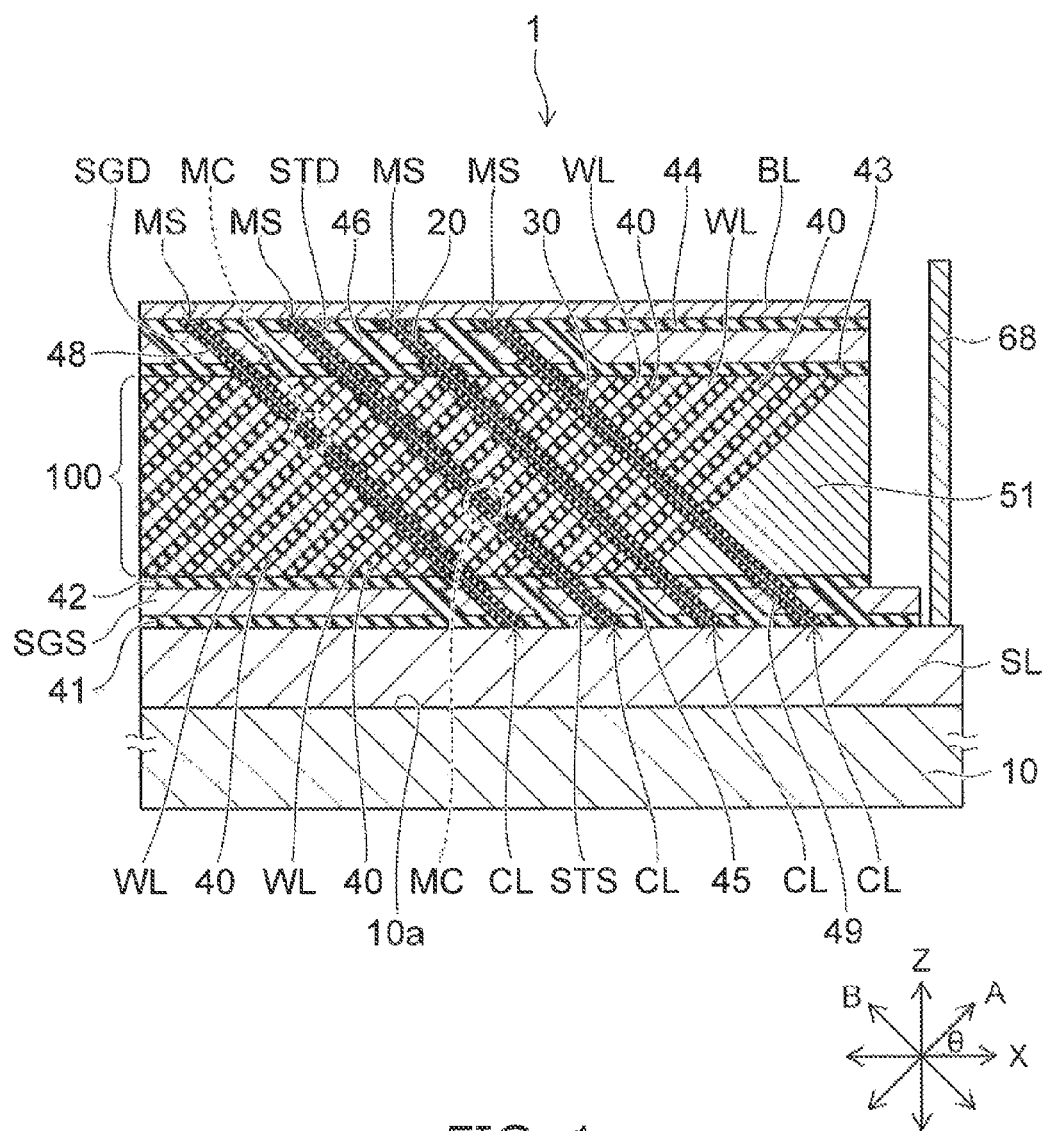
FIG. 1 is a schematic sectional view of a semiconductor memory device of a first embodiment.

According to one embodiment, a semiconductor memory device includes a substrate including a major surface; a plurality of first films having conductivity or semiconductivity, the first films being provided above the substrate and extending in a first direction inclined with respect to the major surface; a plurality of second films having conductivity, the second films being provided above the substrate and extending in a second direction inclined with respect to the major surface and crossing the first direction; and a plurality of storage films provided in crossing sections of the first films and the second films.

Embodiments are described below with reference to the drawings. Note that, in the drawings, the same components are denoted by the same reference numerals and signs.

First Embodiment

FIG. 1 is a schematic sectional view of a semiconductor memory device of a first embodiment.

Figure 2:
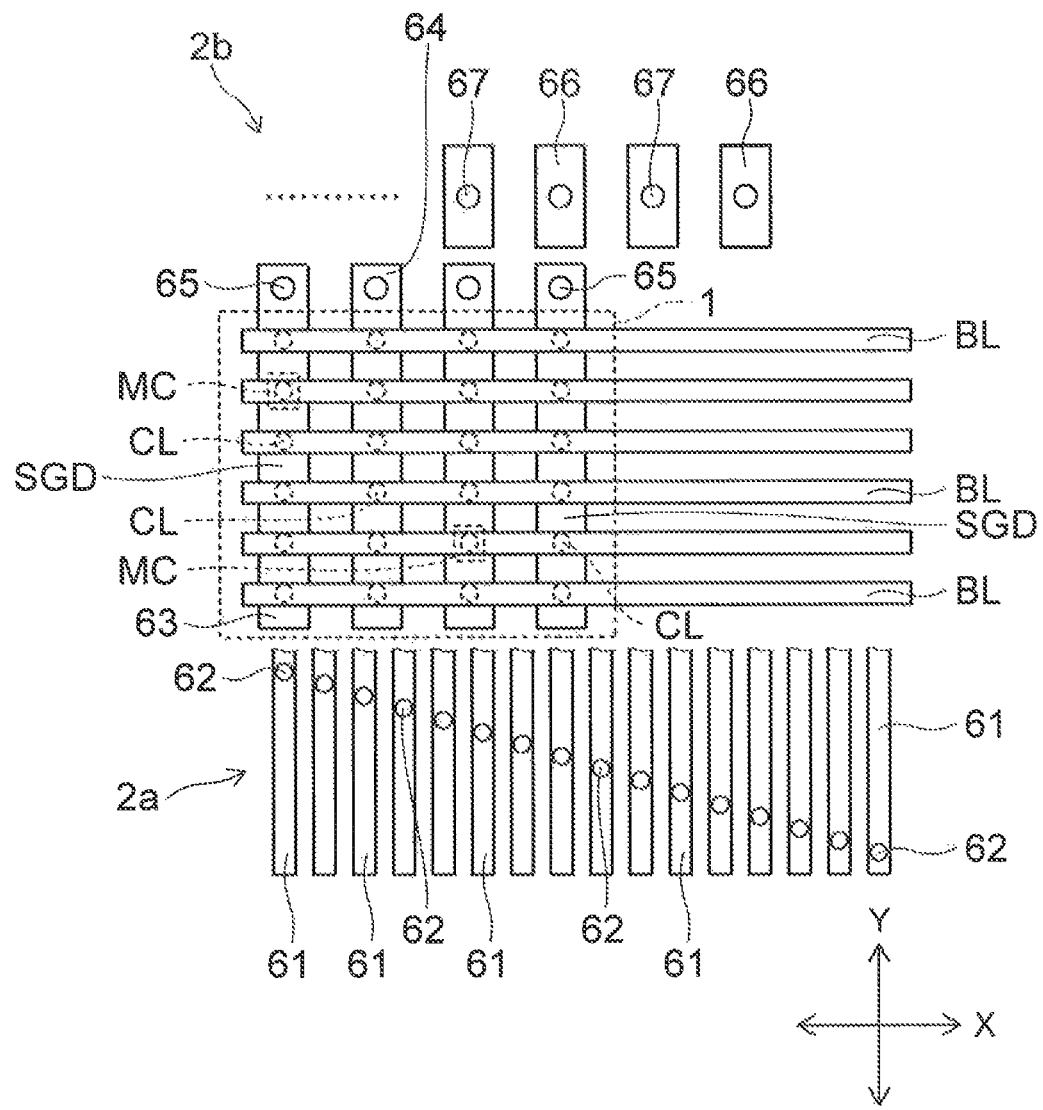
FIG. 2 is a schematic plan view of the semiconductor memory device of the first embodiment.

FIG. 2 is a schematic plan view of main components of the semiconductor memory device of the first embodiment.

The semiconductor memory device of the first embodiment includes a substrate 10, a stacked body 100 provided above the substrate 10, and a plurality of columnar sections CL provided piercing through the stacked body 100 toward the substrate 10 side.

Upper end portions opposite to lower end portions on the substrate 10 side of the plurality of columnar sections CL project from the stacked body 100 in a cell region 1 indicated by a broken line in FIG. 2. The upper end portions of columnar sections CL are provided in a matrix shape. The stacked body 100 is provided in the cell region 1 and cell outer regions 2a and 2b on the outer sides of the cell region 1. A plurality of contact electrodes 62, 65, and 67 are provided on the stacked body 100 in the cell outer regions 2a and 2b.

As shown in FIG. 1, the stacked body 100 is provided on a major surface 10a of the substrate 10. The substrate 10 is a semiconductor substrate and is, for example, a silicon substrate.

Two directions orthogonal to each other on a plane shown in FIG. 2 are represented as an X-direction and a Y-direction. The major surface 10a of the substrate 10 is a plane substantially parallel to an XY plane. A direction orthogonal to the XY plane or the major surface 10a of the substrate 10 is represented as a Z-direction. FIG. 1 shows a cross section parallel to an XZ plane.

A source layer SL is provided on the major surface 10a of the substrate 10. The source layer SL is, for example, a silicon layer containing silicon as a main component. Impurities that impart conductivity are doped in the silicon layer. Alternatively, the source layer SL is a layer containing metal or a metal compound.

On the source layer SL, a source side select gate (a lower gate layer) SGS is provided via an insulating film 41. On the source side select gate SGS, the stacked body 100 is provided via an insulating film 42. On the stacked body 100, a drain side select gate (an upper gate layer) SGD is provided via an insulating film 43.

The source side select gate SGS is provided as a tabular layer substantially parallel to the major surface 10a of the substrate 10. The drain side select gate SGD is also provided as a tabular layer substantially parallel to the major surface 10a of the substrate 10.

The stacked body 100 includes a plurality of electrode films WL functioning as second films having conductivity and a plurality of insulating films 40. The plurality of electrode films WL and the plurality of insulating films 40 are alternately stacked one by one. The insulating films 40 are provided among the electrode films WL. The electrode films WL and the insulating films 40 are alternately stacked in a direction (in FIG. 1, a B-direction) inclined with respect to the major surface 10a of the substrate 10.

The electrode films WL and the insulating films 40 are provided as tabular layers inclined with respect to the major surface 10a of the substrate 10. As shown in FIG. 1, the electrode films WL and the insulating films 40 tilt in an A-direction inclined an angle θ with respect to the X-direction. The electrode films WL and the insulating films 40 spread in a tabular shape (a layered shape) in a direction (in FIG. 2, the Y-direction) piercing through the paper surface in FIG. 1. That is, the electrode films WL and the insulating films 40 are alternately stacked in a B-direction inclined with respect to the major surface 10a of the substrate 10. The inclination angle θ of the electrode films WL and the insulating films 40 with respect to the major surface 10a of the substrate 10 is, for example, not less than 5° and not more than 85°.

As described below, a thick conductive layer 51 is provided on the source side select gate SGS via the insulating film 42. A plurality of trenches extending in the A-direction are formed on the conductive layer 51, whereby the conductive layer 51 is separated into the plurality of tabular electrode films WL inclined along the A-direction.

The plurality of columnar sections CL are provided to pierce through the stacked body 100. The columnar sections CL pierce through the stacked body 100 (the electrode films WL and the insulating films 40) and extend in the B-direction crossing the A-direction in which the electrode films WL and the insulating films 40 are inclined. For example, the columnar sections CL extend in the B-direction orthogonal to the A-direction. In this case, an inclination angle of the columnar sections CL with respect to the major surface 10a of the substrate 10 is also not less than 5° and not more than 85°.

The columnar sections CL also pierce through the drain side select gate SGD in the B-direction. The columnar sections CL also pierce through the source side select gate SGS in the B-direction. The columnar sections CL extend in the B-direction piercing through the drain side select gate SGD, the stacked body 100, and the source side select gate SGS and reach the source layer SL.

The electrode films WL, the source side select gate SGS, and the drain side select gate SGD are silicon layers containing silicon as a main component. Impurities that impart conductivity are doped in the silicon layers. Alternatively, the electrode films WL, the source side select gate SGS, and the drain side select gate SGD may contain metal or metal silicide.

The thickness of the source side select gate SGS and the thickness of the drain side select gate SGD are larger than the thickness of one electrode film WL.

Figure 3:
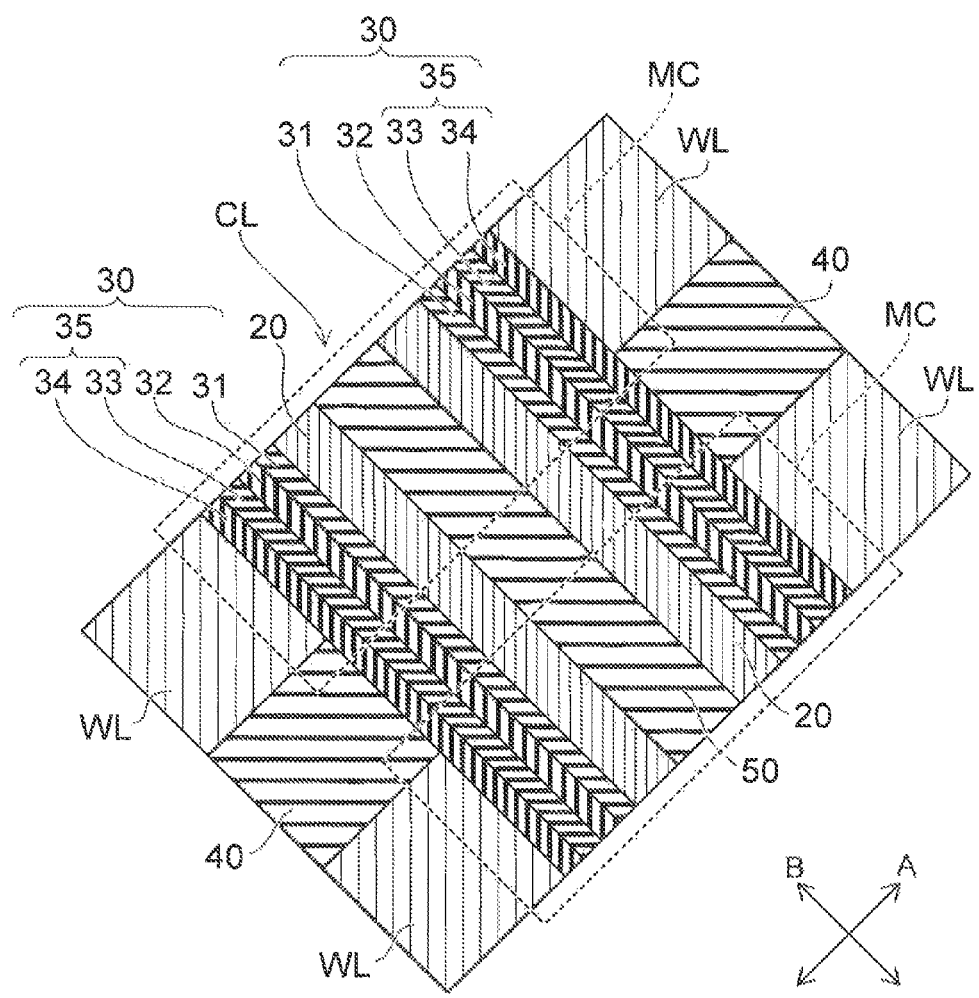
FIG. 3 is an enlarged schematic sectional view of the semiconductor memory device of the first embodiment.

FIG. 3 is an enlarged schematic sectional view of a part of the columnar section CL.

Figure 8A:
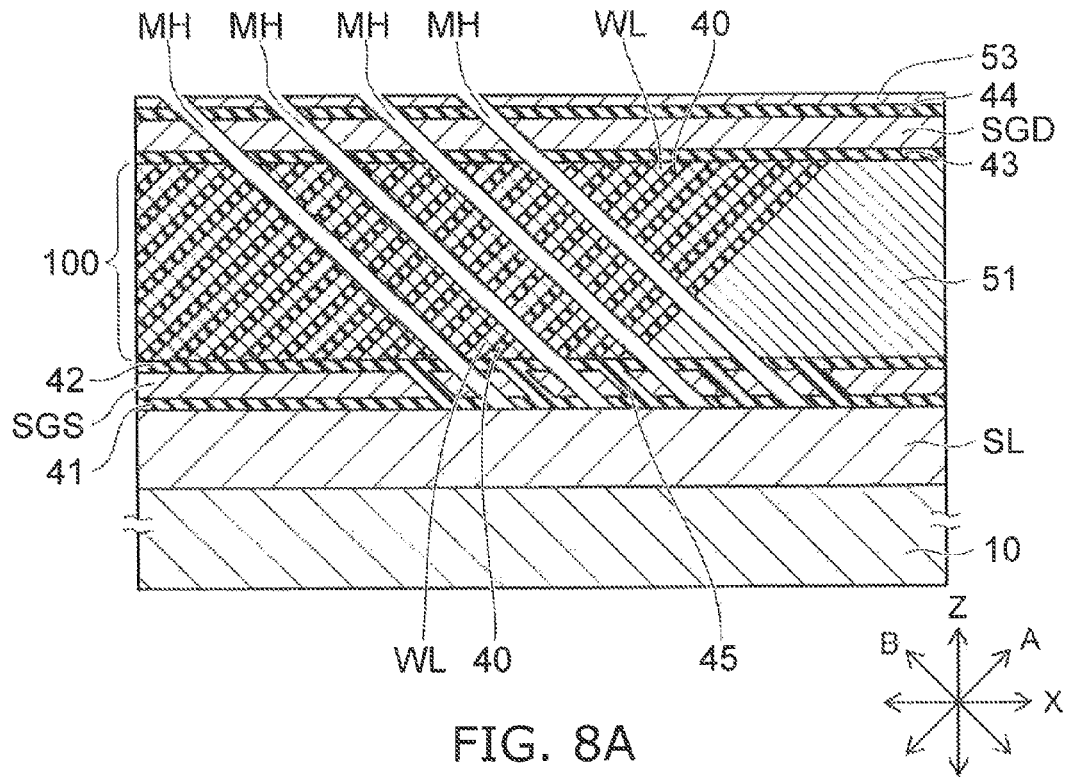

The columnar section CL is formed in a memory hole MH (FIGS. 8A and 8B) extending in the B-direction piercing through the drain side select gate SGD, the stacked body 100, and the source side select gate SGS. In the memory hole MH, a channel body (a semiconductor body) 20 functioning as a semiconductive first film is provided. The channel body 20 is, for example, a silicon film. Impurity concentration of the channel body 20 is lower than impurity concentration of the electrode films WL.

A memory film 30 is provided between the inner wall of the memory hole MH and the channel body 20. The memory film 30 includes a block insulating film 35, a charge storage film 32, and a tunnel insulating film 31.

Between the electrode films WL and the channel body 20, the block insulating film 35, the charge storage film 32, and the tunnel insulating film 31 are provided in order from the electrode film WL side.

The channel body 20 is provided in a cylindrical shape extending in a stacking direction of the stacked body 100 (the B-direction). The memory film 30 is provided in a cylindrical shape while extending in the stacking direction of the stacked body 100 (the B-direction) to surround the outer circumferential surface of the channel body 20.

The cylindrical or columnar channel body 20 pierces through the layered plurality of electrode films WL and extends in the B-direction. A plurality of the channel bodies 20 cross the plurality of electrode films WL. The memory film (a storage film) 30 including the charge storage film 32 is provided in crossing sections of the channel body 20 and the electrode films WL.

The memory film 30 including the charge storage film 32 and the channel body 20 continuously extend in the B-direction.

The electrode films WL surround the channel body 20 via the memory film 30. A core insulating film 50 is provided on the inner side of the channel body 20. The core insulating film 50 is, for example, a silicon oxide film.

The block insulating film 35 is in contact with the electrode films WL, the tunnel insulating film 31 is in contact with the channel body 20, and the charge storage film 32 is provided between the block insulating film 35 and the tunnel insulating film 31.

Memory cells MC having a structure in which the electrode films WL surround channels are formed in crossing sections of the channel body 20 and the electrode films WL. The channel body 20 functions as channels in the memory cells MC. The electrode films WL function as control gates of the memory cells MC. The charge storage film 32 functions as a data storage layer that stores charges injected from the channel body 20.

The semiconductor memory device of the embodiment is a nonvolatile semiconductor memory device that can electrically freely perform erasing and writing of data and can retain stored content even if a power supply is turned off.

The memory cell MC is, for example, a memory cell of a charge trap type. The charge storage film 32 includes a large number of trap sites that trap charges. The charge storage film 32 is, for example, a silicon nitride film.

The tunnel insulating film 31 functions as a potential barrier when charges are injected into the charge storage film 32 from the channel body 20 or when charges stored in the charge storage film 32 diffuse to the channel body 20. The tunnel insulating film 31 is, for example, a silicon oxide film.

Alternatively, as the tunnel insulating film 31, a stacked film (an ONO film) having a structure in which a silicon nitride film is sandwiched by a pair of silicon oxide films may be used. When the ONO film is used as the tunnel insulating film 31, compared with a single layer of a silicon oxide film, an erasing operation can be performed in a low electric field.

The block insulating film 35 prevents the charges stored in the charge storage film 32 from dispersing to the electrode films WL. The block insulating film 35 includes a cap film 34 provided in contact with the electrode films WL and a block film 33 provided between the cap film 34 and the charge storage film 32.

The block film 33 is, for example, a silicon oxide film. The cap film 34 is a film having a dielectric constant higher than the dielectric constant of silicon oxide and is, for example, a silicon nitride film. By providing such a cap film 34 in contact with the electrode films WL, it is possible to suppress back tunnel electrons injected from the electrode films WL during erasing. By using a stacked film of the silicon oxide film and the silicon nitride film as the block insulating film 35, it is possible to improve a charge blocking property.

As shown in FIG. 1, a drain side select transistor STD is provided at one end portion of the columnar section CL. A source side select transistor STS is provided at the other end portion.

The drain side select gate SGD functions as a gate electrode (a control gate) of the drain side select transistor STD. An insulating film 48 functioning as a gate insulating film of the drain side select transistor STD is provided between the drain side select gate SGD and the channel body 20. The channel body 20 of the drain side select transistor STD is connected to a bit line BL above the drain side select gate SGD.

The bit line BL is provided on the drain side select gate SGD via an insulating film 44. As shown in FIG. 2, a plurality of bit lines BL extend in the X-direction. The bit line BL is, for example, a metal film formed in a line shape.

The drain side select gate SGD is divided in the X-direction by an isolating film 46. That is, the drain side select gate SGD is divided in the X-direction among the columnar sections CL adjacent to one another in the X-direction and is discontinuous.

The source side select gate SGS functions as a gate electrode (a control gate) of the source side select transistor STS. An insulating film 49 functioning as a gate insulating film of the source side select transistor STS is provided between the source side select gate SGS and the channel body 20. The channel body 20 of the source side select transistor STS is connected to the source layer SL below the source side select gate SGS.

The source side select gate SGS is divided in the X-direction by an isolating film 45. That is, the source side select gate SGS is divided in the X-direction among the columnar sections CL adjacent to one another in the X-direction and is discontinuous.

A plurality of the memory cells MC including the electrode films WL of respective layers as control gates are provided between the drain side select transistor STD and the source side select transistor STS. The plurality of memory cells MC, the drain side select transistor STD, and the source side select transistor STS are connected in series through the channel body 20 and configure one memory string MS. A plurality of the memory strings MS are provided. Therefore, the plurality of memory cells MC are three-dimensionally provided in the A-direction, the B-direction, and the Y-direction.

The plurality of memory strings MS, that is, the plurality of memory cells MC are disposed to correspond to the cell region 1 as shown in FIG. 2. The cell outer regions 2a and 2b are provided on the outer sides of cell region 1. The cell outer region 2a and the cell outer region 2b are located across the cell region 1 in the Y-direction.

The electrode film WL includes a lower end portion on the substrate 10 side and an upper end portion opposite to the lower end side. In the cell region 1, the upper end portion in a part of the electrode film WL is located under a stacked structure including the bit line BL and the drain side select gate SGD. Therefore, space for forming a contact electrode connected to the upper end portion of the electrode film WL in the cell region 1 is small.

The electrode film WL extends in a tabular shape in the Y-direction (the direction piercing through the paper surface in FIG. 1) and is also provided in the cell outer regions 2a and 2b. As shown in FIG. 2, a contact section 61 is formed at the upper end portion of the electrode film WL in the cell outer region 2a.

One end portion (a first end portion) 63 in the Y-direction of the drain side select gate SGD does not extend to the cell outer region 2a where the contact section 61 of the electrode film WL is disposed. The other end portion (a second end portion) 64 in the Y-direction of the drain side select gate SGD extends to the cell outer region 2b. The bit line BL extends in the X-direction and is not disposed in the cell outer regions 2a and 2b further on the outer sides in the Y-direction than the cell region 1.

Therefore, the contact electrode 62 can be connected to the contact section (the upper end portion) 61 of the electrode film WL in the cell outer region 2a without being restricted by the disposition of the drain side select gate SGD and the bit line BL.

The contact electrode 62 pierces through a not-shown insulating film provided on the contact section 61 in the cell outer region 2a and reaches the contact section 61 of a connection target electrode film WL. A not-shown word interconnect is formed on the insulating film. The electrode film WL is electrically connected to the word interconnect via the contact electrode 62.

The second end portion (a contact section) 64 of the drain side select gate SGD is connected to a contact electrode 65 for a drain side select gate in the cell outer region 2b. The contact electrode 65 pierces through a not-shown insulating film provided on the second end portion 64 in the cell outer region 2b and reaches the second end portion 64 of a connection target drain side select gate SGD. A not-shown drain-side gate interconnect is formed on the insulating film. The drain side select gate SGD is electrically connected to the drain-side gate interconnect via the contact electrode 65.

One end portion 66 in the Y-direction of the source side select gate SGS extends to the cell outer region 2b and further extends to the outer side in the Y-direction than the second end portion 64 of the drain side select gate SGD. The one end portion (a contact section) 66 of the source side select gate SGS is connected to a contact electrode 67 for a source side select gate.

The contact electrode 67 pierces through a not-shown insulating film provided on the end portion 66 in the cell outer region 2b and reaches the end portion 66 of a connection target source side select gate SGS. A not-shown source-side gate interconnect is formed on the insulating film. The source side select gate SGS is electrically connected to a source-side gate interconnect via the contact electrode 67.

As shown in FIG. 1, the source layer SL is connected to a contact electrode 68 that extends in the Z-direction in a cell outer region further on the outer side in the X-direction than the cell region 1. The contact electrode 68 is connected to a not-shown upper layer interconnect (a source wire).

As shown in FIG. 2, the plurality of columnar sections CL (memory strings MS) arrayed in the X-direction are connected to a common bit line BL. The plurality of columnar sections CL arrayed in the Y-direction pierce through a common drain side select gate SGD. The plurality of columnar sections CL arrayed in the Y-direction pierce through a common source side select gate SGS.

For one columnar section CL, n (n is an integer not less than 2) memory cells MC having a structure in which the electrode films WL surround the channel body 20 via the charge storage film 32 are provided. That is, each of the memory strings MS includes the n memory cells MC connected in series in the B-direction shown in FIG. 1.

In each of the memory strings MS, a cell on the end side in the extending direction of the columnar section CL (the B-direction) is sometimes not used as a memory cell.

Figure 4:
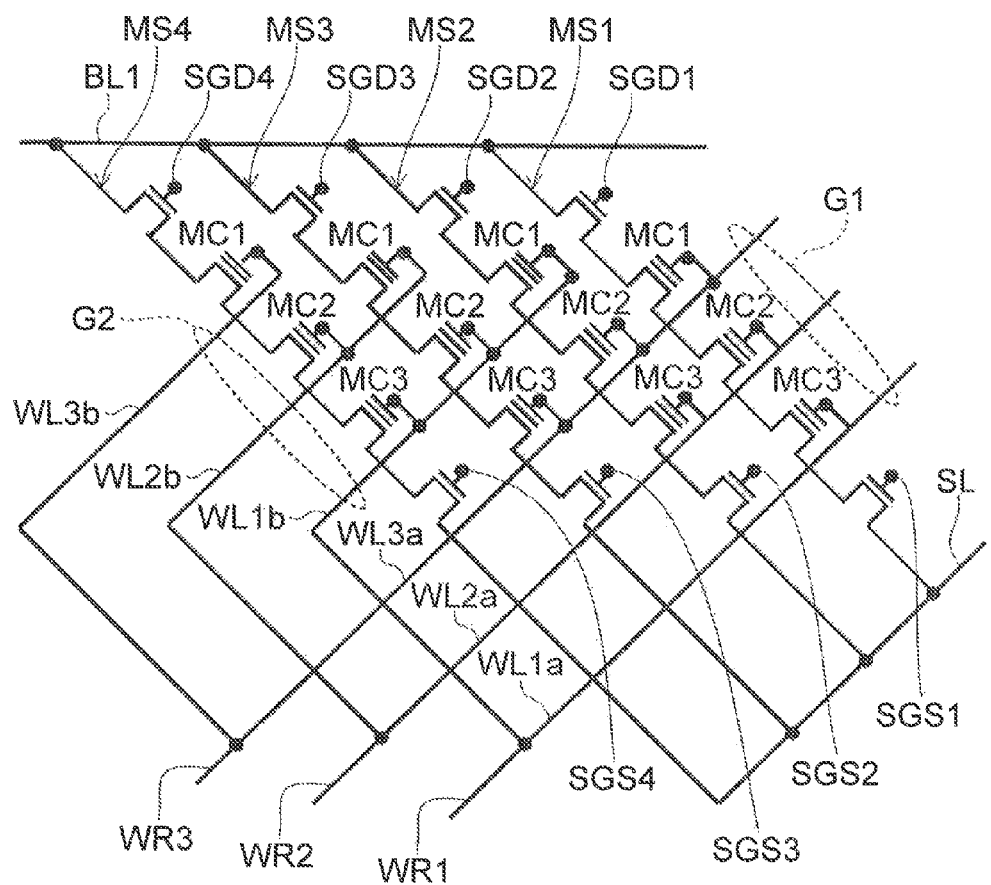
FIG. 4 is an equivalent circuit diagram of the semiconductor memory device of the first embodiment.

FIG. 4 is an equivalent circuit diagram of the semiconductor memory device of the embodiment. In FIG. 4, for example, four memory strings MS1 to MS4 connected to one bit line BL are shown.

The memory strings MS1 to MS4 respectively include drain side select gates SGD1 to SGD4. The memory strings MS1 to MS4 respectively include source side select gates SGS1 to SGS4.

In an example shown in FIG. 4, each of the memory strings MS1 to MS4 includes, for example, three memory cells MC1 to MC3. In each of the memory strings MS1 to MS4, memory cells connected in series from the drain side select gates SGD1 to SGD4 side are represented as MC1, MC2, and MC3.

The electrode films WL in the plurality of layers are divided into a plurality of groups G1 and G2 each including n (in the example shown in FIG. 4, for example, three) electrode films WL. The group G1 includes three electrode films WL1a, WL2a, and WL3a. The group G2 includes three electrode films WL1b, WL2b, and WL3b. The electrode films WL1a, WL2a, WL3a, WL1b, WL2b, and WL3b are respective electrode films in different layers.

The memory cell MC1 of the memory string MS4 is connected to the electrode film WL3b.

The memory cell MC2 of the memory string MS4 and the memory cell MC1 of the memory string MS3 are connected to the electrode film WL2b in the same layer.

The memory cell MC3 of the memory string MS4, the memory cell MC2 of the memory string MS3, and the memory cell MC1 of the memory string MS2 are connected to the electrode film WL1b in the same layer.

The memory cell MC3 of the memory string MS3, the memory cell MC2 of the memory string MS2, and the memory cell MC1 of the memory string MS1 are connected to the electrode film WL3a of the same layer.

The memory cell MC3 of the memory string MS2 and the memory cell MC2 of the memory string MS1 are connected to the electrode film WL2a in the same layer.

The memory cell MC3 of the memory string MS1 is connected to the electrode film WL1a.

Each of the memory strings MS1 to MS4 includes one memory cell including the electrode film WL1a or WL1b as a control gate, includes one memory cell including the electrode film WL2a or WL2b as a control gate, and includes one memory cell including the electrode film WL3a or WL3b as a control gate.

The electrode films WL one each selected from each of the groups G1 and G2 are collectively controlled by common potential.

That is, the electrode film WL1a and the electrode film WL1b are connected to a common word interconnect WR1. The electrode film WL1a and the electrode film WL1b are collectively subjected to potential control through the word interconnect WR1. Similarly, the electrode film WL2a and the electrode film WL2b are connected to a common word interconnect WR2. The electrode film WL2a and the electrode film WL2b are collectively subjected to potential control through the word interconnect WR2. Similarly, the electrode film WL3a and the electrode film WL3b are connected to a common word interconnect WR3. The electrode film WL3a and the electrode film WL3b are collectively subjected to potential control through the word interconnect WR3. In the example shown in FIG. 4, the electrode films provided at intervals of two layers are collectively controlled by common potential. Therefore, word interconnects equivalent to the number of stacked layers of the electrode films WL do not have to be provided.

A method for manufacturing the semiconductor memory device of the first embodiment is described with reference to FIGS. 5A to 10B.

Figure 5A:
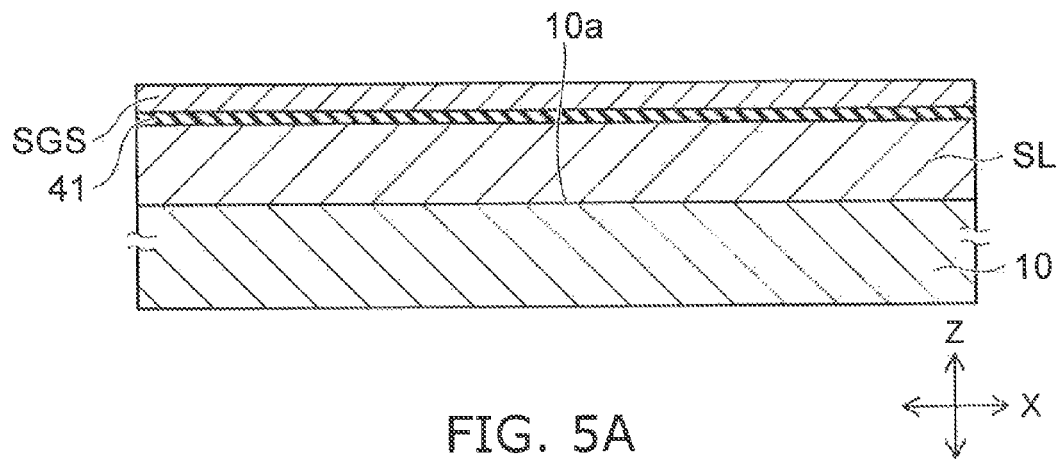
FIGS. 5A to 10B are schematic sectional views showing a method for manufacturing the semiconductor memory device of the first embodiment.

As shown in FIG. 5A, the source layer SL, the insulating film 41, and the source side select gate (the lower gate layer) SGS are formed in order on the major surface 10a of the substrate 10. The source layer SL, the insulating film 41, and the source side select gate (the lower gate layer) SGS are stacked in the Z-direction perpendicular to the major surface 10a of the substrate 10.

Figure 5B:
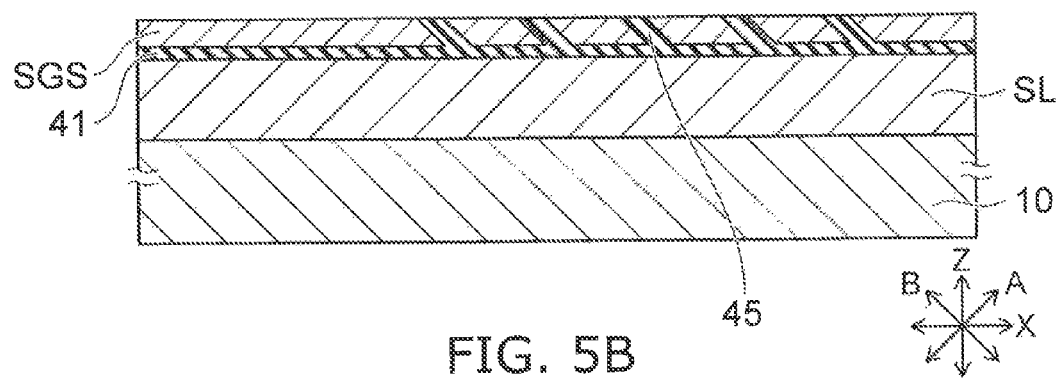

Slits are formed in the source side select gate SGS. The isolating film 45 shown in FIG. 5B is buried in the slits. The slits pierce through the source side select gate SGS in the B-direction inclined with respect to the major surface 10a of the substrate 10.

Figure 5C:
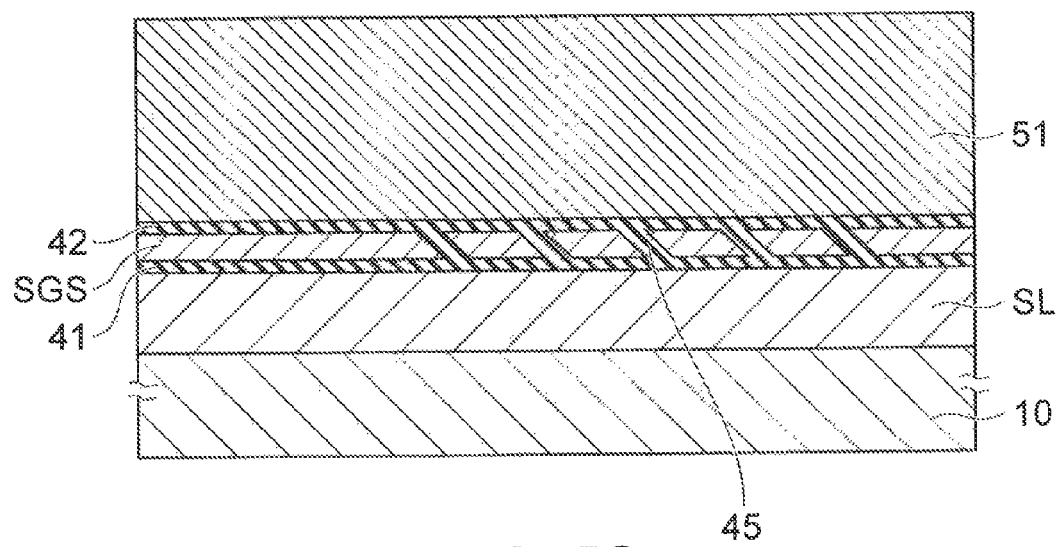

On the source side select gate SGS and on the isolating film 45, as shown in FIG. 5C, the insulating film 42 is formed, The conductive layer 51 is formed on the insulating film 42.

The thickness of each of the insulating films 41 and 42 and the source side select gate SGS is, for example, several tens nm. The thickness of the conductive layer 51 is larger than the thickness of each of the insulating films 41 and 42 and the source side select gate SGS.

The length or the width in the A-direction of the electrode films WL shown in FIG. 1 depends on the thickness of the conductive layer 51. That is, the number of memory cells MC arrayed in the A-direction depends on the thickness of the conductive layer 51. The thickness of the conductive layer 51 is, for example, in micron order.

Figure 6A:
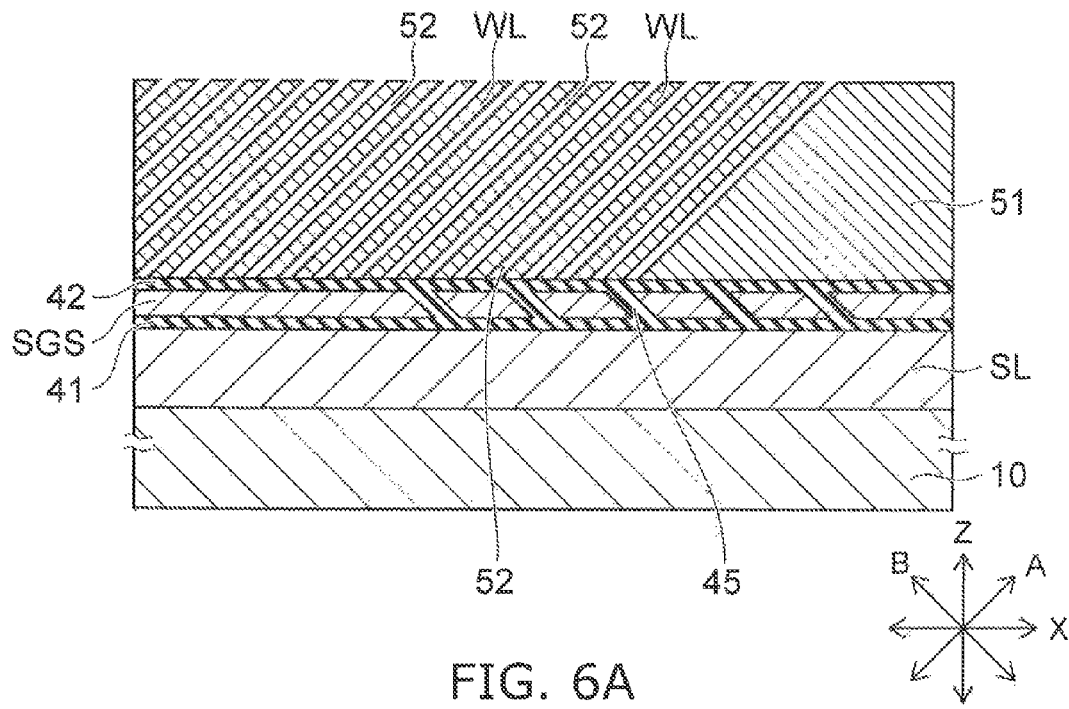

The conductive layer 51 is etched. As shown in FIG. 6A, a plurality of trenches 52 are formed in the conductive layer 51. The conductive layer 51 is separated into the plurality of electrode films WL by the plurality of trenches 52.

The trenches 52 extend piercing through the conductive layer 51 in the A-direction inclined with respect to the major surface 10a of the substrate 10 and reach the insulating film 42. The electrode films WL are formed in a tabular shape (a layer shape) inclined along the A-direction. The tabular plurality of electrode films WL overlap one another via the trenches 52 in the B-direction orthogonal to the A-direction.

Figure 9A:
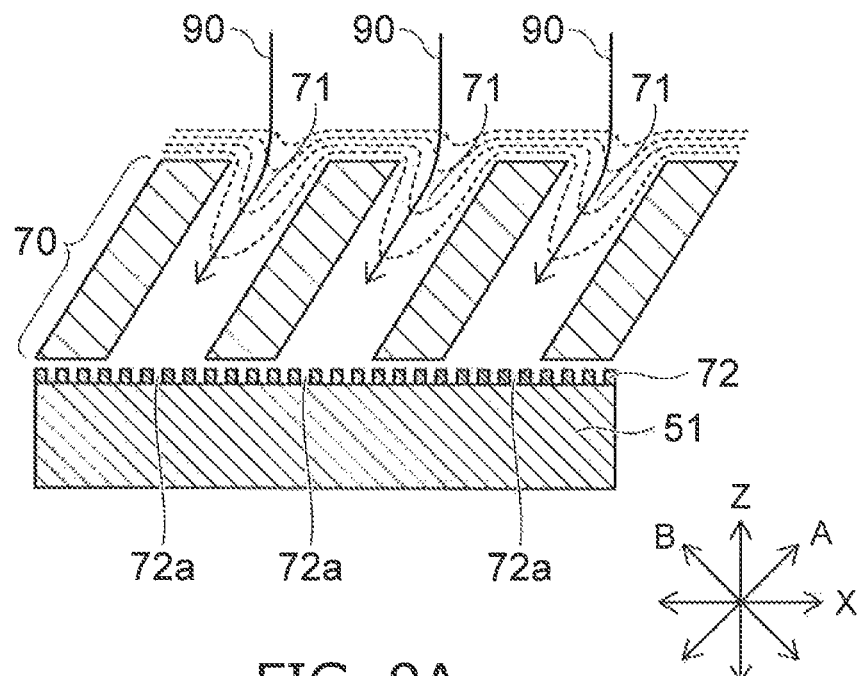

As shown in FIG. 9A, a mask layer 72 is formed on the surface of the conductive layer 51. In the mask layer 72, slit-like openings 72a extending in a direction piercing through the paper surface in FIG. 9A are formed. The conductive layer 51 is etched by RIE (Reactive Ion Etching), which is anisotropic dry etching, using the mask layer 72. The trenches 52 are formed.

A wafer having a stacked structure shown in FIG. 5C is supported on a lower electrode in an etching chamber. Plasma is generated in the chamber. Ions in the plasma accelerate toward the wafer with bias potential given to the wafer side via the lower electrode.

Usually, in dry etching (RIE) performed using plasma, a thin charge layer called ion sheath layer is formed on a wafer surface that is a target of etching. Positive ions are accelerated in a direction perpendicular to the ion sheath layer and the wafer surface and made incident on the wafer surface, whereby the etching proceeds. The ion sheath layer is formed to thinly cover the wafer surface. Therefore, when the wafer is simply tilted, the ion sheath layer also tilts. It is impossible to make ions incident in a direction inclined with respect to the wafer surface to advance the etching.

Therefore, in the embodiment, on the wafer surface, an electric field control body 70 is disposed contiguous to the mask layer 72. The electric field control body 70 is a metal body including a plurality of slits 71. The slits 71 incline along the A-direction and pierce through the electric field control body 70. The mask layer 72 is located between the wafer including the substrate 10 and the conductive layer 51 and the electric field control body 70.

When metal is exposed in the chamber, there is a concern about contamination in the chamber due to the etched metal. Therefore, it is desired to cover the surface of the electric field control body 70 of the metal body with an insulating film. In order to prevent the metal from being exposed by the etching of the insulating film, the insulating film is formed in sufficient thickness (e.g., several tens µm order). Alternatively, the electric field control body 70 may be formed of conductive silicon sufficiently containing impurities such as phosphorus.

An equipotential surface represented by a broken line in FIG. 9A is formed in the slits 71 by the electric field control body 70 including the slits 71 inclined along the A-direction. Therefore, ion tracks 90 are bent in the A-direction from the direction perpendicular to the wafer surface near the openings of the slits 71. Therefore, the ions accelerated in the A-direction are made incident on the conductive layer 51.

A pitch in the X-direction of the plurality of slits 71 of the electric field control body 70 and a pitch in the X-direction of a plurality of the openings 72a of the mask layer 72 do not coincide with each other. The pitch in the X-direction of the slits 71 is larger than the pitch in the X-direction of the openings 72a. The width in the X-direction of the slit 71 of the electric field control body 70 is larger than the width in the X-direction of the opening 72a of the mask layer 72. The plurality of openings 72a of the mask layer 72 are disposed in a range of the width in the X-direction of one slit 71.

A region covered with the electric field control body 70 during the etching shown in FIG. 9A is exposed under the slits 71 and etched by moving the electric field control body 70 in, for example, the X-direction. That is, the electric field control body 70 is moved in the X-direction to etch the entire region of an etching target of the conductive layer 51.

The ions, the incidence direction of which is controlled by the electric field control body 70, are made incident on the surface of the conductive layer 51 exposed in the openings 72a of the mask layer 72. The etching of the conductive layer 51 proceeds in the A-direction from the surface exposed in the openings 72a of the mask layer 72.

Figure 10A:
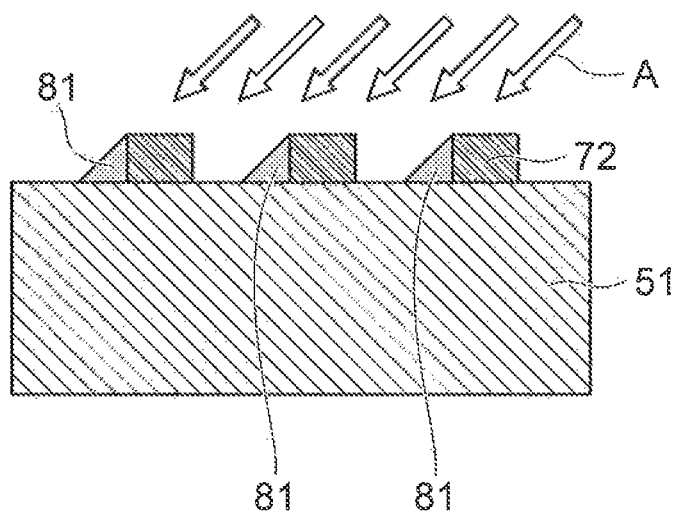

After being formed over the entire surface of the conductive layer 51, the mask layer 72 is patterned using a lithography technique. However, it is difficult to control a side surface shape of the openings 72a. In general, as shown in FIG. 10A, an opening side surface of the mask layer 72 has a perpendicular shape with respect to the surface of the conductive layer 51.

The ions are not made incident on a region right under the mask layer 72 directly covered with the mask layer 72. The ions are made incident in an oblique direction A inclined with respect to the surface of the conductive layer 51. Therefore, in an opening region not directly covered with the mask layer 72, shadows 81 of the mask layer 72, on which the ions are not irradiated, occur.

Figure 10B:
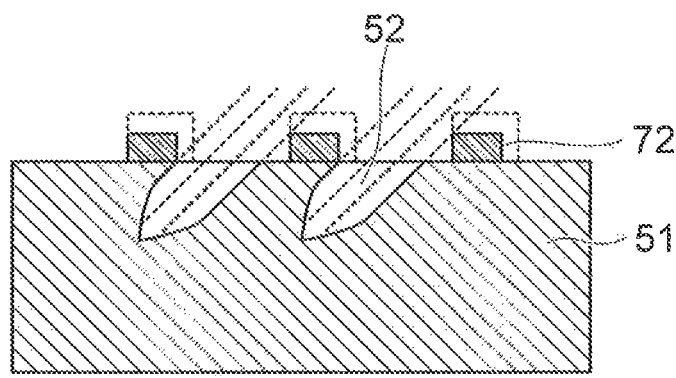

A difference in an etching rate occurs between the shadows 81 and parts that are not the shadows 81. The difference in the etching rate causes shape deterioration (tapering) of the trenches 52 formed in the conductive layer 51 as shown in FIG. 10B. The shape deterioration of the trenches 52 could lead to fluctuation in the thickness of the electrode films WL and lead to fluctuation in device characteristics.

Regions where the shadows 81 are projected on the surface of the conductive layer 51 are larger as the thickness of the mask layer 72 is larger. Depending on an etching selection ratio of the material of the mask layer 72 and the material to be etched (the conductive layer 51), in order to prevent disappearance of the mask layer 72, the mask layer 72 sometimes has to be formed thick.

For example, a resist used in general as a mask for processing of silicon, which is the material of the conductive layer 51, is often etched according to the progress of the etching of the conductive layer (the silicon layer) 51, although an etching rate of the resist is lower than the etching rate of the conductive layer 51. The outer shape of the mask layer 72 before etching is schematically illustrated by a broken line in FIG. 10B.

In order to suppress deterioration in a processing shape of the trench 52 due to the influence of the shadows 81, the mask layer 72 is desirably thin.

Figure 9B:
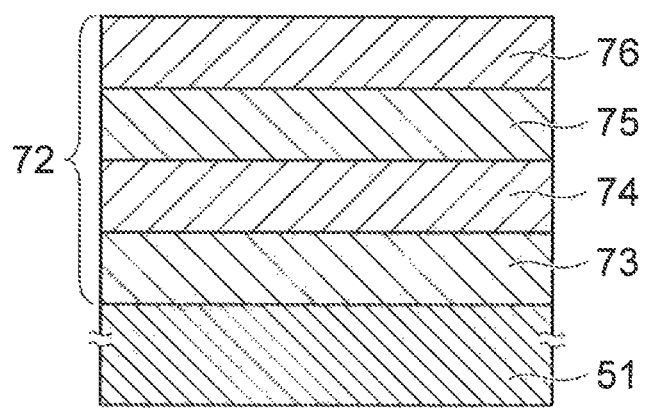

Therefore, of the embodiment, as shown in FIG. 9B, the mask layer 72 is multi-layered by layers of different kinds of materials. Mask patterns of upper layers are transferred to lower layers in order.

For example, on the conductive layer 51, a silicon oxide ($SiO_2$) layer 73, a carbon layer 74 formed by a Chemical Vapor Deposition (CVD) method, a silicon oxide layer 75 formed by the CVD method, and a resist layer 76 are stacked in order.

The mask layer 72, which is a stacked film of the layers 73 to 76, is formed over the entire surface of an etching target region of the conductive layer 51. First, the resist layer 76 is patterned by exposure and development on the resist layer 76. The pattern of the resist layer 76 is transferred to the layers 75, 74, and 73 under the resist layer 76 in order.

The material of the layers 73 to 76 and an etching gas are appropriately set such that an etching selection ratio among the layers 73 to 76 in contact with one another in the stacking direction is high, whereby the uppermost layer in which the opening pattern is formed is formed as a thin film. Consequently, it is possible to reduce regions formed as shadows on which the ions are not irradiated. It is possible to control the trenches 52 to an appropriate shape.

Figure 6B:
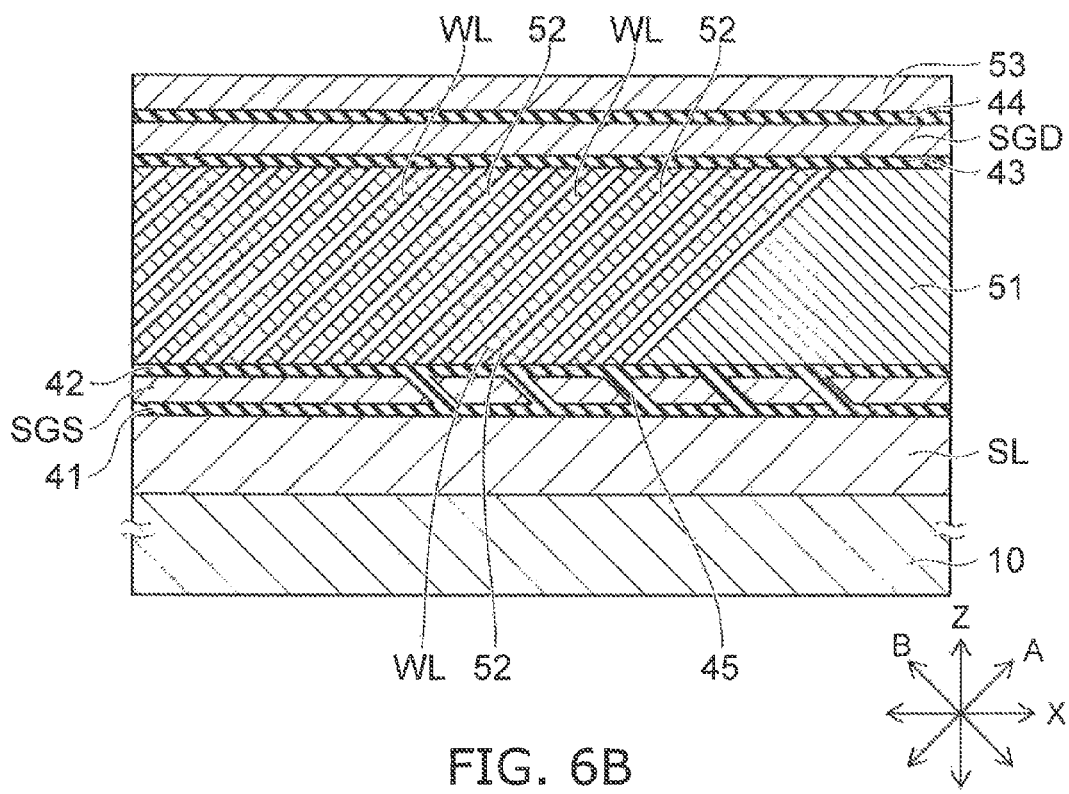

After the trenches 52 are formed in the conductive layer 51, as shown in FIG. 6B, the insulating film 43 is formed on the conductive layer 51. The insulating film 43 closes the openings of the trenches 52. Note that the insulating film 43 may be deposited on the insides of the trenches 52 or may not be deposited.

The drain side select gate (the upper gate layer) SGD is formed on the insulating film 43. The layer 53 is formed on the drain side select gate SGD via the insulating film 44. The layer 53 is a layer of a material different from the material of the insulating film 40 buried in the trenches 52 in a process described below. For example, the insulating film 40 is a silicon oxide film. The layer 53 is a silicon layer.

Figure 7A:
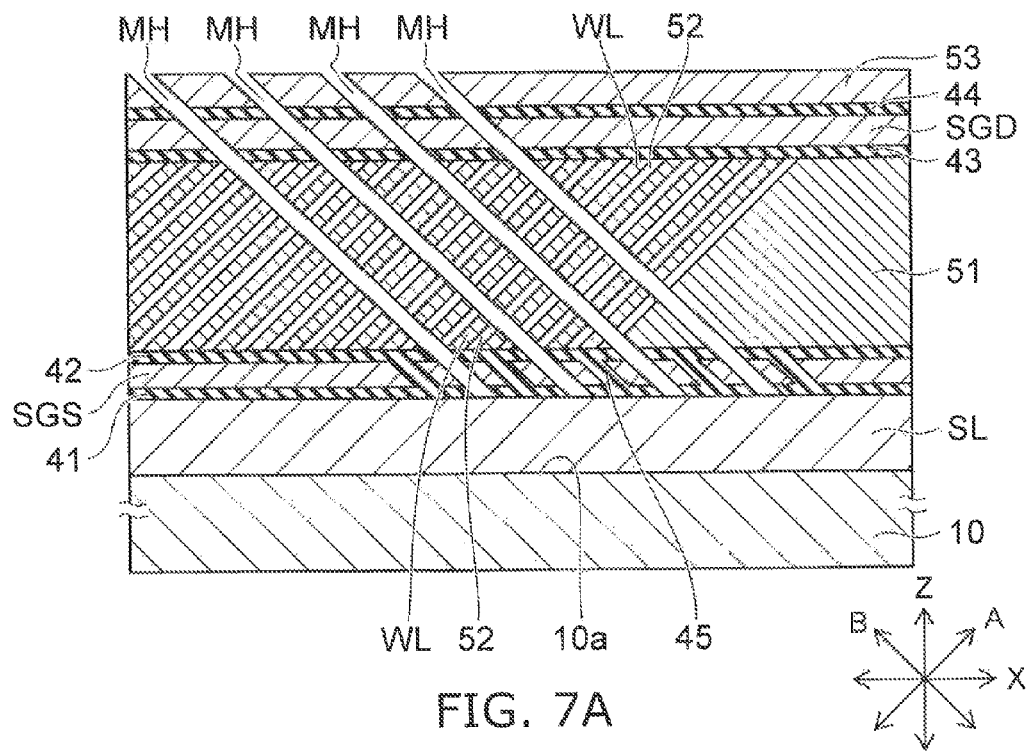

In a stacked body on the source layer SL shown in FIG. 6B, as shown in FIG. 7A, a plurality of memory holes MH are formed.

The memory holes MH extend in a direction inclined with respect to the major surface 10a of the substrate 10, which is the B-direction crossing the A-direction. The B-direction is, for example, orthogonal to the A-direction.

In the formation of the memory holes MH, as in the formation of the trenches 52, the etching (RIE) method in the oblique direction is applied using the electric field control body 70.

The electric field control body 70 is rotated around the Z axis from a state shown in FIG. 9A, whereby the slits 71 can be inclined in the B-direction.

A not-shown mask layer is formed on the layer 53. A plurality of mask holes (openings) are formed in the mask layer. The electric field control body 70 is disposed contiguous to the mask layer. Ions accelerated in the B-direction by the electric field control body 70 are made incident on the surface of the layer 53 exposed in the mask holes. Etching proceeds in the B-direction for the layer 53, the insulating film 44, the drain side select gate SGD, the insulating film 43, the electrode films WL in the plurality of layers, the insulating film 42, the source side select gate SGS, and the insulating film 41.

The memory holes MH pierce through the layer 53, the insulating film 44, the drain side select gate SGD, the insulating film 43, the electrode films WL in the plurality of layers, the insulating film 42, the source side select gate SGS, and the insulating film 41 in the B-direction and reach the source layer SL.

Figure 7B:
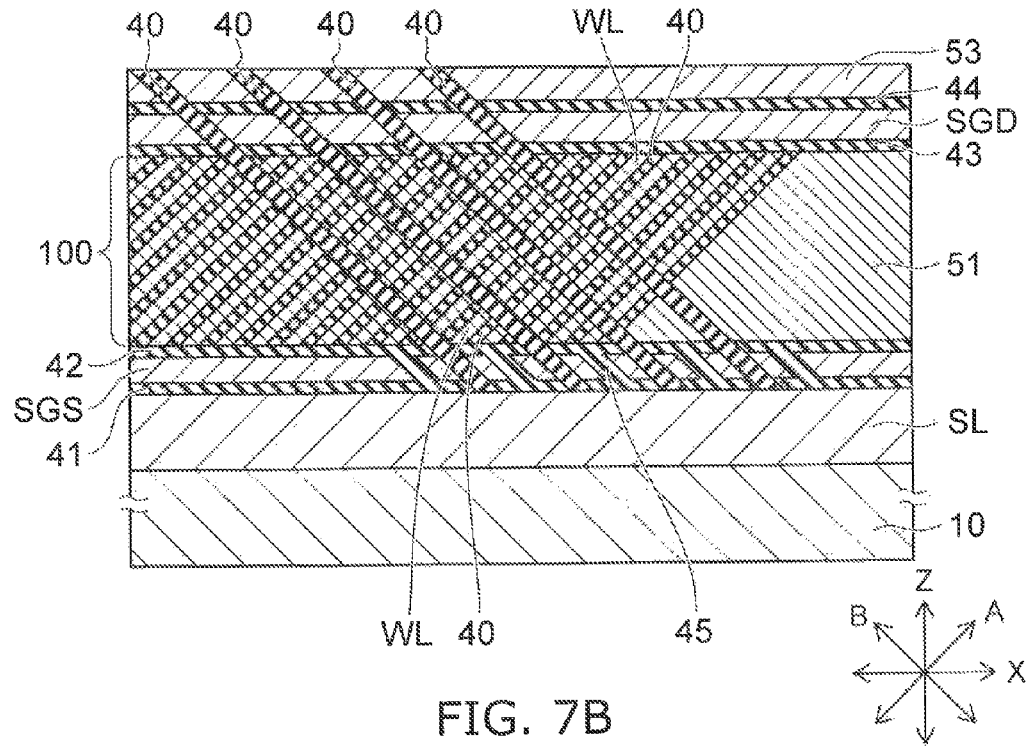

After the memory holes MH are formed, the insulating films 40 are formed in the trenches 52 through the memory holes MH. As shown in FIG. 7B, the insulating films 40 are buried in the trenches 52. The stacked body 100 in which the electrode films WL and the insulating films 40 are alternately stacked in the B-direction is formed.

The insulating films 40 are also buried in the memory holes MH. The insulating films 40 buried in the memory holes MH are removed as shown in FIG. BA by the dry etching (RIE), in which etching anisotropically proceeds in the B-direction, using the electric field control body 70 as in the formation of the memory holes MH. The insulating films 40 among the electrode films WL remain without being removed.

In this case, etching of the insulating films (the silicon oxide layers) 40 in the memory holes MH is performed using the layer 53, which is the silicon layer, as a mask. The layer 53 is already patterned by the process in FIG. BA for forming the memory holes MH. Therefore, a lithography process for separately forming a mask for etching of the insulating film 40 in the memory holes MH is unnecessary.

Figure 8B:
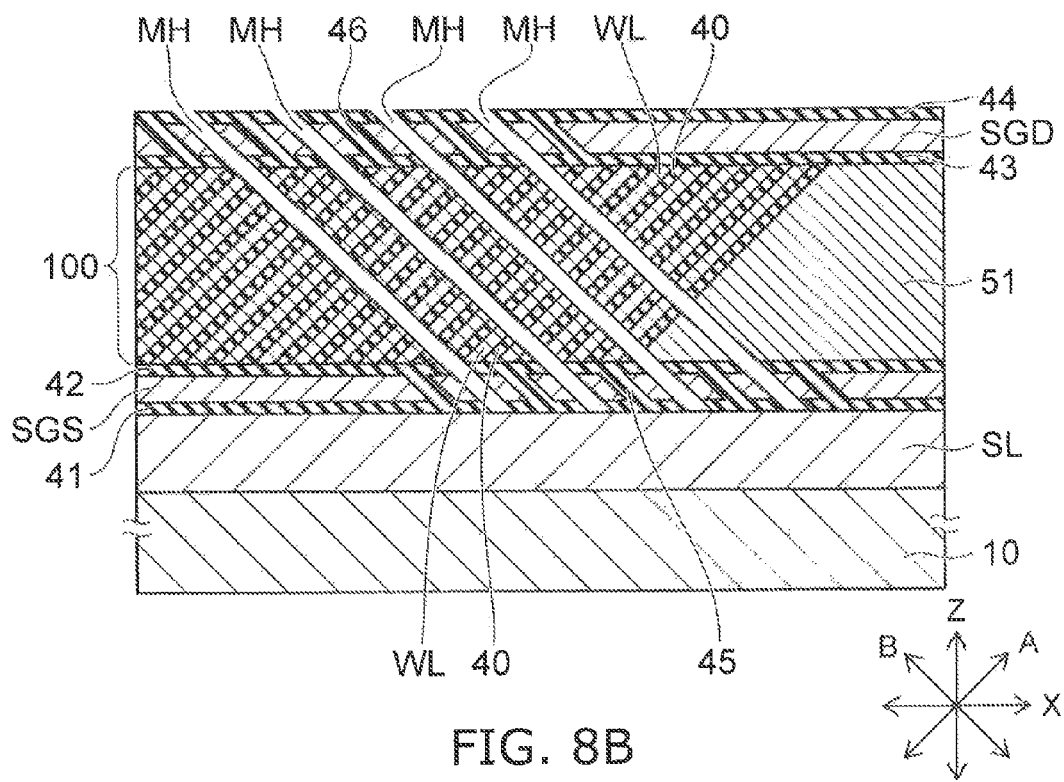

The layer 53 is a silicon layer. The insulating film 44 under the layer 53 is a silicon oxide layer. The layer 53 is removed by etch-back with a condition having etching selectivity with respect to the insulating film 44. After the layer 53 is removed, slits are formed in the drain side select gate SGD. The isolating films 46 shown in FIG. 8B are buried in the slits. The slits pierce through the drain side select gate SGD in the B-direction inclined with respect to the major surface 10a of the substrate 10.

The columnar sections CL are formed in the memory holes MH. That is, the memory films 30 shown in FIGS. 1 and 3 are formed on the sidewalls of the memory holes MH. Further, the channel bodies 20 are formed on the inner sides of the memory films 30.

Alternatively, after the process in FIG. 7A, the memory films 30 can be formed on the sidewalls of the memory holes MH. In this case, by appropriately setting the dimensions of the trenches 52 and the memory holes MH and the film thickness of a part (e.g., the block insulating films 35) of the memory films 30 formed on the outer circumferential sides of the memory holes MH, the trenches 52 can be filled by the part of the memory films 30. Therefore, in some case, it is possible to omit the processes shown in FIGS. 7B to 8A.

Whichever of the formation of the isolating films 46 that divide the drain side select gate SGD and the formation of the columnar sections CL may be performed first.

Of the embodiment described above, even if the process for alternately depositing the electrode films WL and the insulating films 40 one by one is not repeated, the stacked structure of the electrode films WL in the plurality of layers can be formed by collective processing of the plurality of trenches 52 in the conductive layer 51 using a technique for advancing etching in a direction inclined with respect to the major surface 10a of the substrate 10.

As shown in FIG. 7A, etching is advanced in the B-direction for the stacked structure in which the electrode layers WL overlap via the trenches 52. The memory holes MH are formed. The etching is not etching for the stacked body in which the electrode films WL and the insulating films 40 are alternately stacked and is collective etching of the same kind of materials (the electrode films WL). Therefore, it is easy to set etching conditions. The etching is excellent in shape controllability of the memory holes MH.

Therefore, it is possible to suppress fluctuation in a hole diameter of regions where the memory cells MC are formed in the memory holes MH. As a result, it is possible to suppress characteristic fluctuation among the memory cells MC.

The length or the width in the A-direction of the electrode films WL depends on the thickness of the conductive layer 51. Therefore, it is possible to increase bit density simply by forming the conductive layer 51 thick without increasing the number of processes for alternately depositing the electrode films WL and the insulating films 40.

Therefore, of the embodiment, it is possible to secure bit density equivalent to the bit density of the already-proposed three-dimensional memory while realizing a considerable reduction in the number of processes and costs.

The conductive layer 51 is, for example, a polycrystalline silicon layer. However, if the conductive layer 51 is formed thick, crystal particles of silicon increase in size. It is possible to improve mobility in the electrode films WL.

In a stacked body in which the electrode films WL are stacked in the Z-direction, a structure is conceivable in which a step structure section including the electrode films WL of the respective layers processed into a step shape is formed in a part of the stacked body and contact sections of the electrode films WL in the respective layers are formed.

On the other hand, of the embodiment, the upper end portions of the electrode films WL exposed on the surface side of the stacked body 100 in the cell outer region 2a can be directly used as the contact sections 61 for connecting the electrode films WL to the upper layer interconnects (word lines). Therefore, stepwise processing for contacts of the electrode films WL is unnecessary. Consequently, it is possible to considerably reduce the number of processes and costs.

In the example shown in FIG. 2, the contact electrodes 62 of the electrode films WL are disposed in one cell outer region 2a in the Y-direction across the cell region 1. The contact electrodes 65 of the drain side select gates SGD and the contact electrodes 67 of the source side select gates SGS are disposed in the other cell outer region 2b. Alternatively, the contact electrodes 62, 65, and 67 may be disposed in any one of the cell outer regions 2a and 2b.

Second Embodiment

Figure 11:
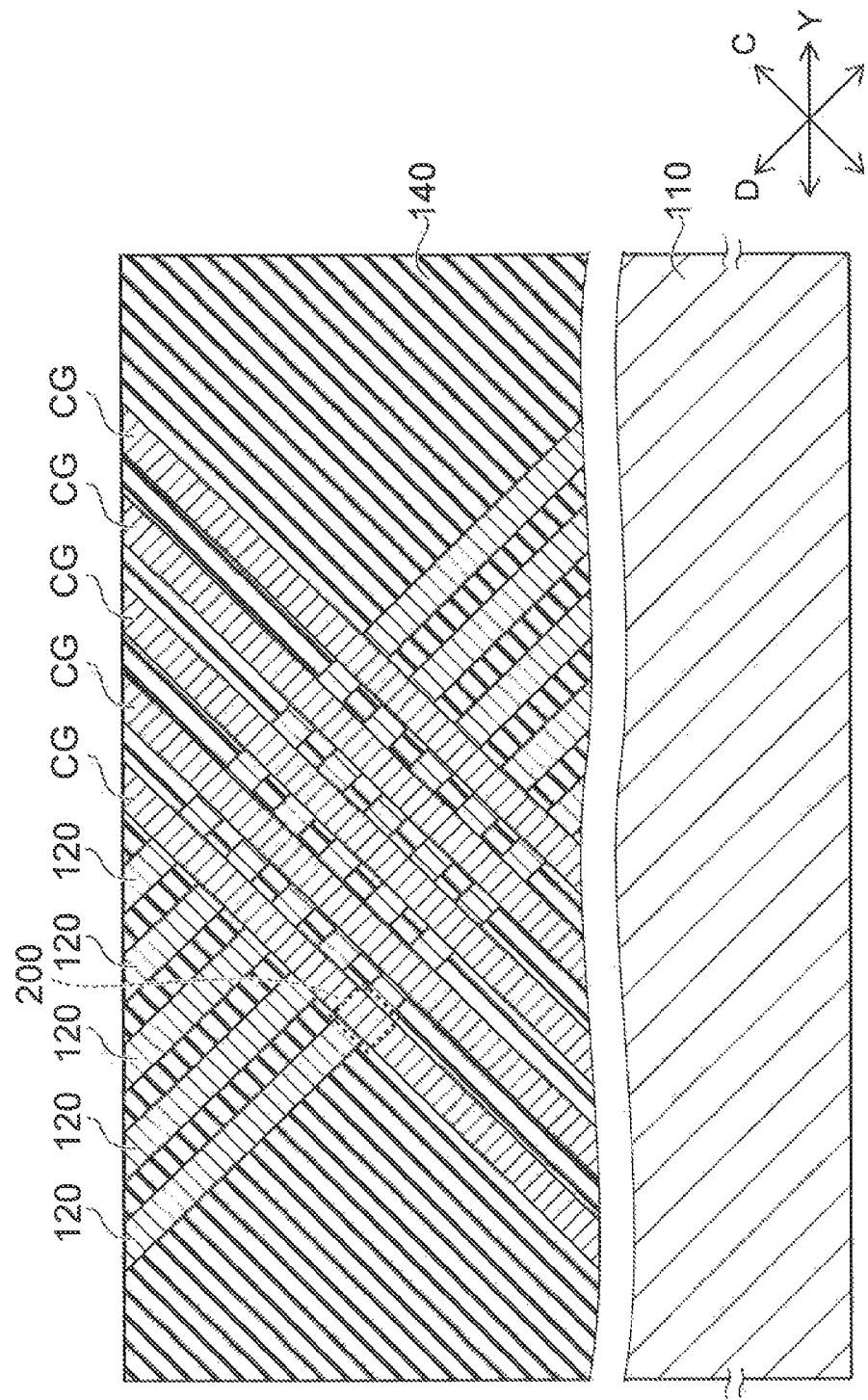
FIG. 11 is a schematic sectional view of a semiconductor memory device of a second embodiment.

FIG. 11 is a schematic sectional view of a semiconductor memory device of a second embodiment.

The semiconductor memory device of the second embodiment includes a substrate 110 and a plurality of memory cells 200 provided above the substrate 110.

Figure 12:
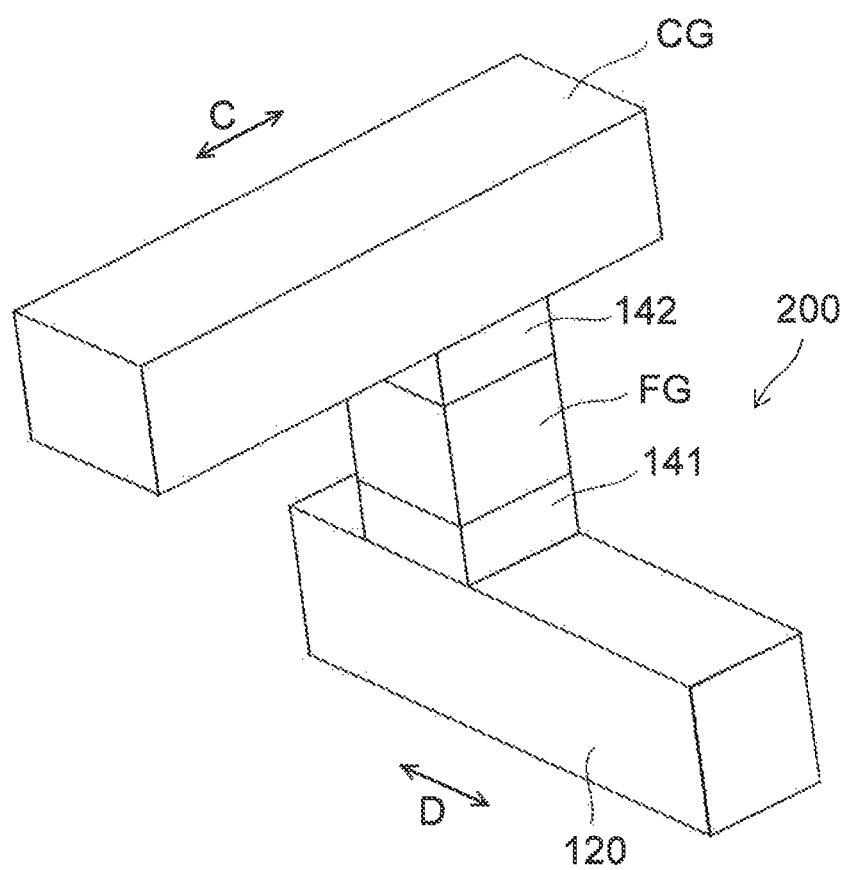
FIG. 12 is a schematic perspective view of a memory cell of the second embodiment.

FIG. 12 is an enlarged schematic perspective view of the memory cell 200.

On the substrate 110, semiconductor films 120 functioning as a plurality of first films having semiconductivity and control gates CG functioning as a plurality of second films having conductivity are provided to cross each other. The memory cells 200 are provided in crossing sections of the semiconductor films 120 and the control gates CG.

The substrate 110 is, for example, a semiconductor substrate and is, specifically, a silicon substrate. In FIG. 11, a direction parallel to a major surface of the substrate 110 is represented as a Y-direction.

The semiconductor films 120 extend in a line shape toward the substrate 110 side in a direction (in FIG. 11, a D-direction) inclined with respect to the major surface of the substrate 110.

The semiconductor films 120 contain silicon as a main component. Further, impurities for imparting conductivity are doped in the semiconductor films 120. Channels of the memory cells 200 are induced in the semiconductor films 120 by potential control of the control gates CG.

The control gates CG extend in a line shape toward the substrate 110 side in a direction inclined with respect to the major surface of the substrate 110, which is a direction (in FIG. 11, a C-direction) crossing the direction in which the semiconductor films 120 extend. For example, the semiconductor films 120 and the control gates CG are orthogonal to each other in a plane perpendicular to the major surface of the substrate 110.

The control gates CG contain silicon as a main component. Further, impurities for imparting conductivity are doped in the control gates CG. Alternatively, the control gates CG contain metal or a metal compound.

An insulating film 140 is provided on the substrate 110. The semiconductor films 120 and the control gates CG are insulated from each other by the insulating film 140.

In the crossing section of the semiconductor film 120 and the control gate CG, as shown in FIG. 12, a floating gate FG is provided as a storage film. The floating gate FG is a semiconductive film or a conductive film capable of storing charges. The floating gate FG contains, for example, silicon as a main component.

An insulating film (a tunnel insulating film) 141 is provided between the semiconductor film 120 and the floating gate FG. An insulating film 142 is provided between the control gate CG and the floating gate FG. An insulating film is also provided around the floating gate FG.

The control gate CG and the floating gate FG are capacitively coupled via the insulating film 142. According to control of potential applied to the control gate CG and the semiconductor film 120, it is possible to inject electrons into the floating gate FG from the semiconductor film 120 or discharge electrons stored in the floating gate FG to the semiconductor film 120.

The floating gate FG is discontinuous in the C-direction and the D-direction and separated. One memory cell 200 includes one floating gate FG surrounded by an insulator. The floating gate FG is covered with the insulator and is not connected to anywhere. Therefore, the electrons stored in the floating gate FG do not leak from the floating gate FG even if a power supply is turned off. Electrons do not enter the floating gate FG anew. That is, the semiconductor memory device of the second embodiment is a nonvolatile semiconductor memory device that can retain data without being supplied with electric power.

The plurality of memory cells 200 are three-dimensionally provided in the C-direction, the D-direction, and the paper surface depth direction in FIG. 11. The plurality of memory cells 200 are directly connected through the semiconductor films 120.

The plurality of semiconductor films 120 are stacked in the C-direction. The upper end portion on the opposite side of the lower end portion on the substrate 110 side of each of the semiconductor films 120 can be exposed above the substrate 110. Therefore, a contact section for connecting each of the semiconductor films 120 to the outside can be provided at the upper end portion of each of the semiconductor films 120. In connecting each of the semiconductor films 120 to the contact section, a part of the stacked structure of the plurality of semiconductor films 120 does not have to be processed into, for example, a step shape.

The plurality of control gates CG are stacked in the D-direction. The upper end portion on the opposite side of the lower end portion on the substrate 110 side of each of the control gates CG can be exposed above the substrate 110. Therefore, a contact section for connecting each of the control gates CG to the outside can be provided at the upper end portion of each of the control gates CG. In connecting each of the control gates CG to the contact section, a part of the stacked structure of the plurality of control gates CG does not have to be processed into, for example, a step shape.

A method for manufacturing the semiconductor memory device of the second embodiment is described with reference to FIGS. 13 to 21B.

Figure 13:
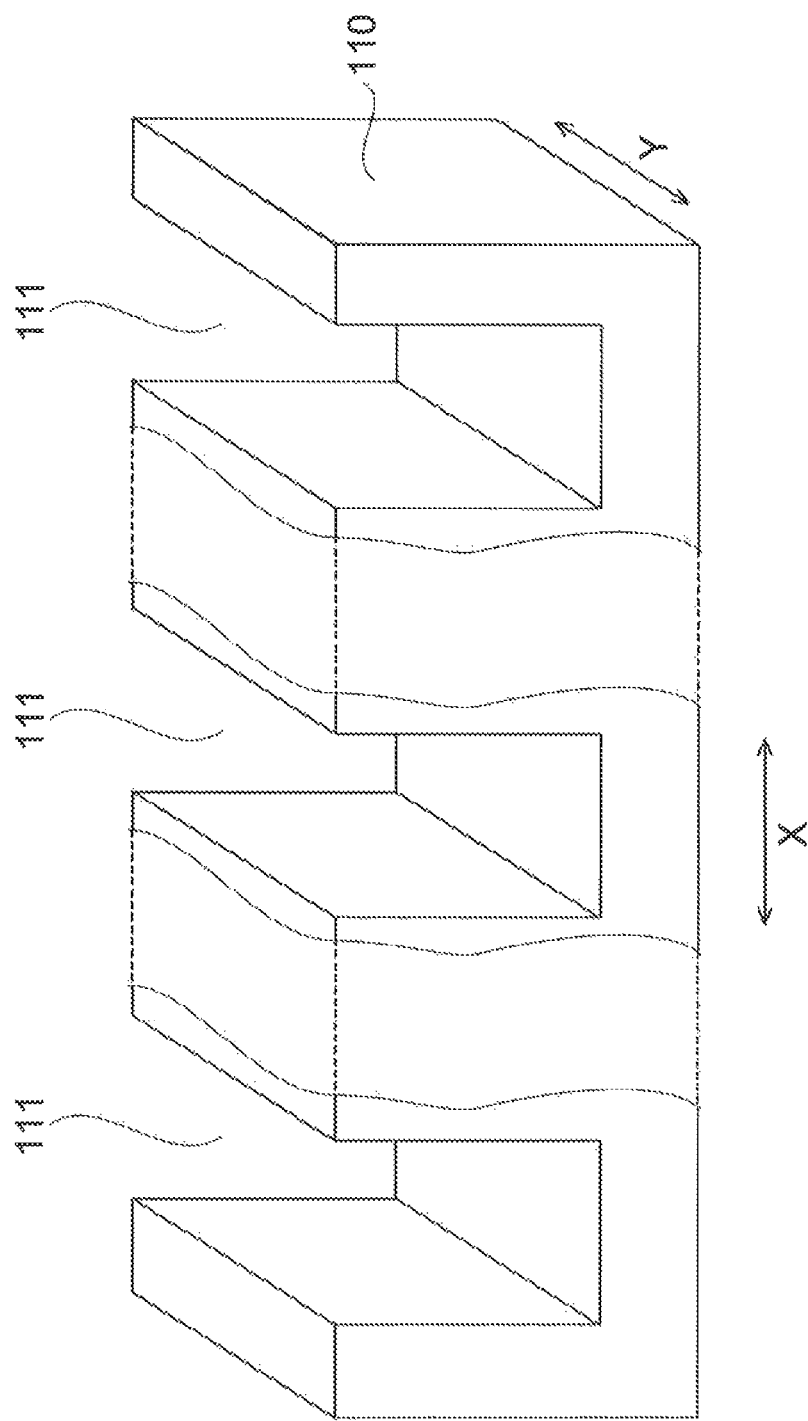

As shown in FIG. 13, a plurality of trenches 111 are formed in, for example, the substrate 110, a part of which is a first film. A Y-direction shown in FIG. 13 corresponds to the Y-direction shown in FIG. 11. An X-direction shown in FIG. 13 is orthogonal to the Y-direction in a plane parallel to the major surface of the substrate 110. The plurality of trenches 111 are arrayed in the X-direction. Each of the trenches 111 extends in the Y-direction.

The substrate 110 is, for example, a silicon substrate. The trenches 111 are not limited to be directly formed on the substrate 110 and may be formed on a semiconductor film (e.g., a polysilicon film) functioning as the first film formed on the substrate 110. That is, the first film may be either a substrate or a semiconductor film formed on the substrate.

Portions adjacent to the sidewalls of the trenches 111 in the substrate 110 become the semiconductor films 120 as described below. Therefore, in terms of process integration, it is desired to form the trenches 111 in the substrate 110.

Figure 14:
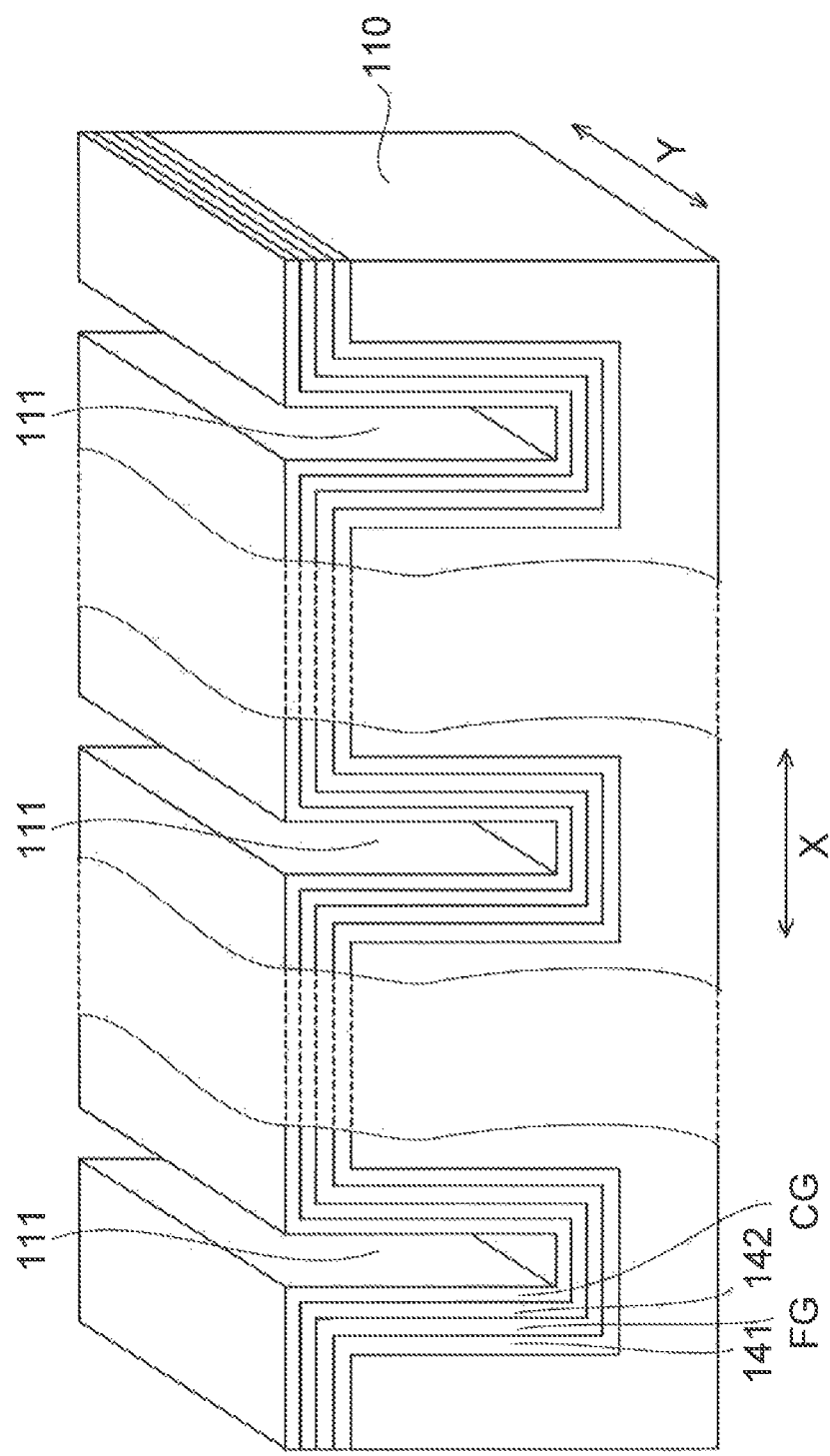

Subsequently, in the trenches 111, as shown in FIG. 14, the insulating film 141, a film to be the floating gates FG, the insulating film 142, and the control gate (a second film) CG are formed in order. The insulating film 141, the film to be the floating gates FG, the insulating film 142, and the control gate CG are conformally formed on the sidewalls and the bottoms of the trenches 111. The insulating film 141, the film to be the floating gates FG, the insulating film 142, and the control gate CG are stacked in order from the side wall sides of the trenches 111. Hollows remain in the centers in the width direction of the trenches 111 (the X-direction).

The insulating films 141 and 142 are, for example, silicon oxide films. The films to be the floating gates FG and the control gate CG are, for example, silicon films.

Subsequently, the control gate CG, the insulating film 142, the film to be the floating gates FG, and the insulating film 141 are etched back by, for example, the RIE method. The films on the substrate 110 retract in the depth direction of the trenches 111.

Figure 15:
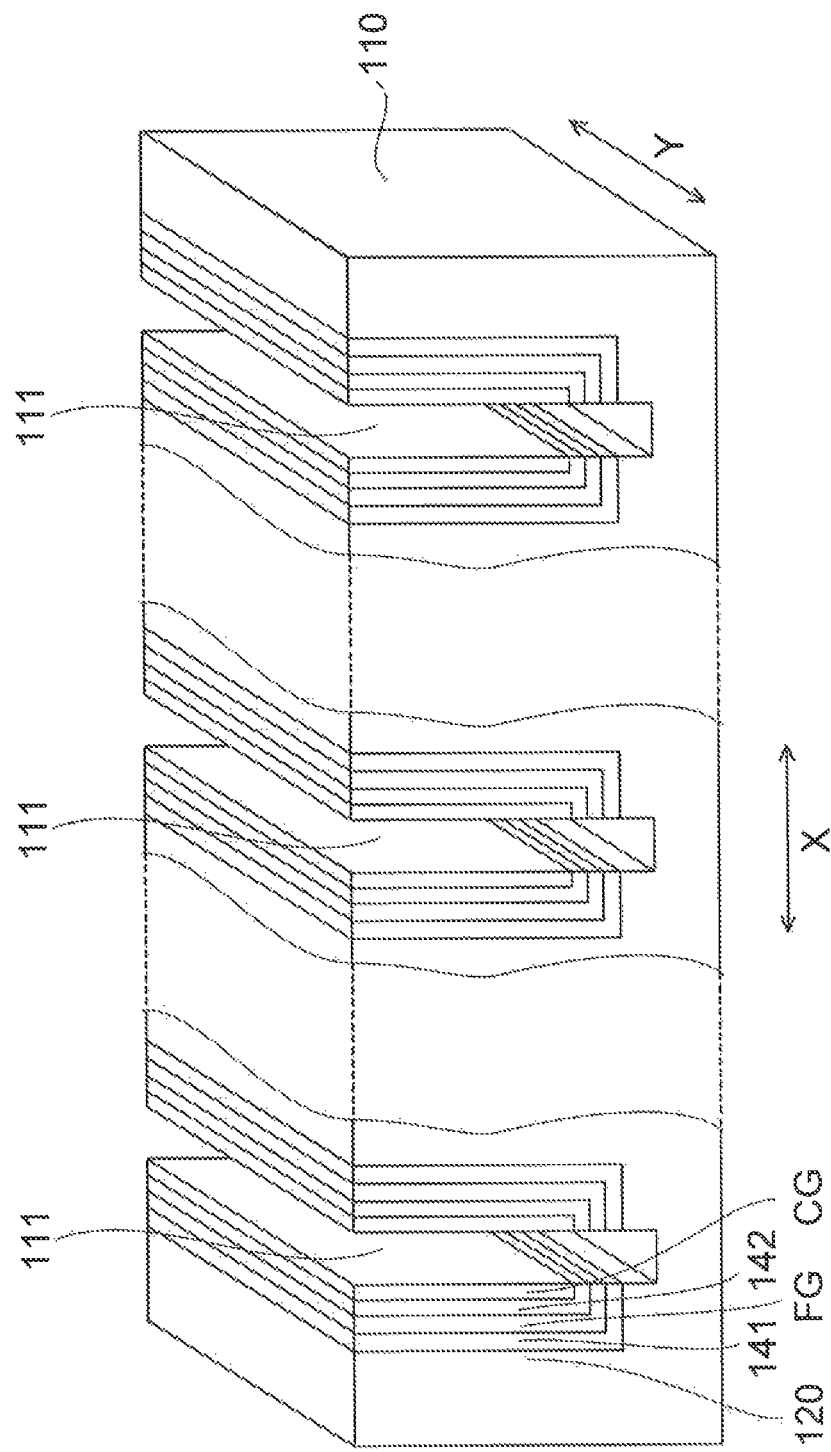

Consequently, the films deposited on the substrate 110 are removed. As shown in FIG. 15, the upper surface of the substrate 110 is exposed. Further, the films deposited on the bottoms of the trenches 111 are divided in the width direction of the trenches 111 (the X-direction). By appropriately setting conditions (a gas type, etc.) during the RIE, it is possible to advance anisotropic etching in the depth direction of trenches 111 while protecting, with the films deposited during the RIE, the control gate CG on the innermost side among the films formed along the sidewalk of the trenches 111. Alternatively, after the control gate CG is deposited, it is possible to protect the control gate CG from the RIE by conformally depositing, in the trenches 111, a sacrificial film (e.g., a silicon oxide film or a silicon nitride film) that protects the sidewall of the control gate CG.

Figure 16:
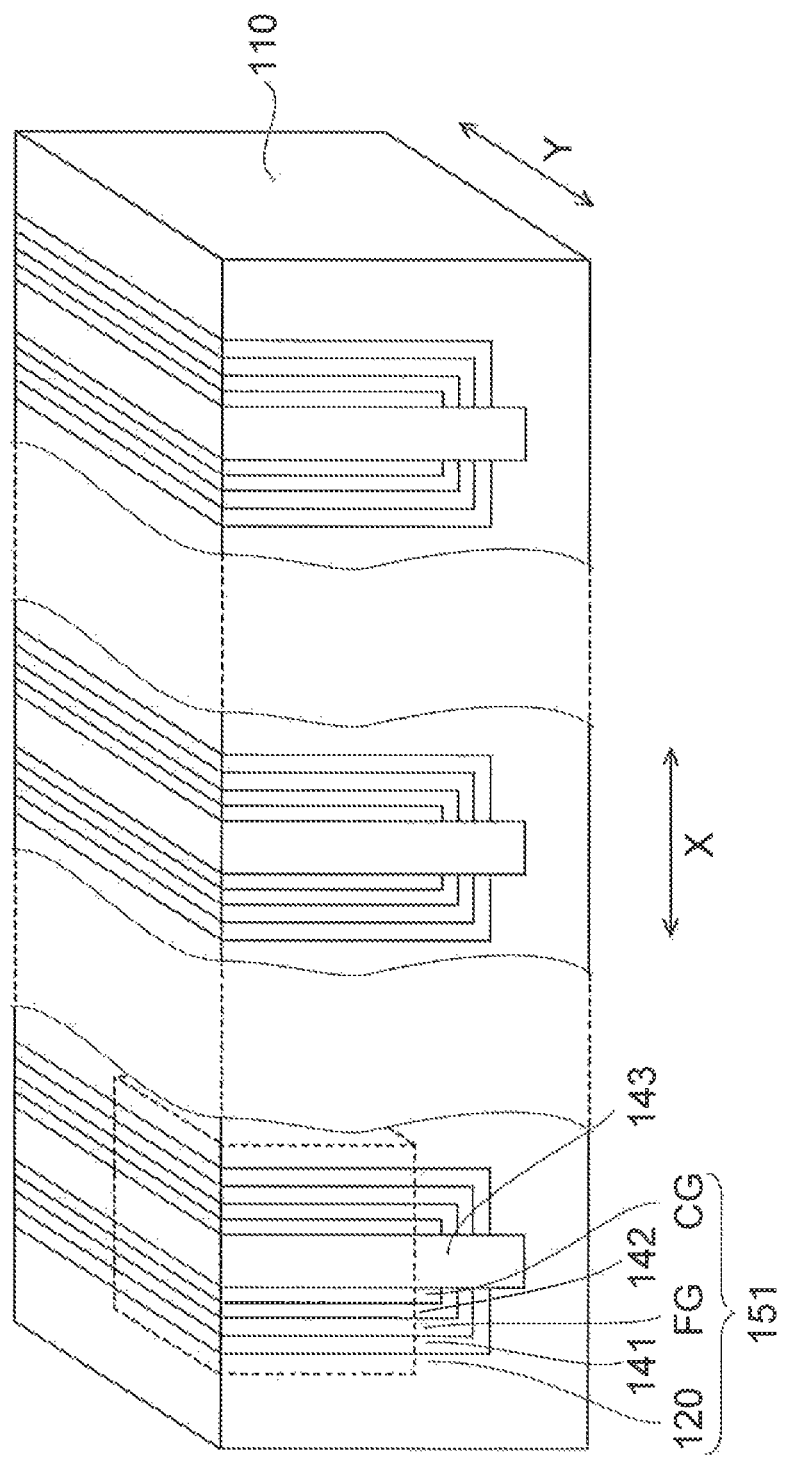

In the hollows remaining on the inner side of the control gate CG, as shown in FIG. 16, an insulating film (e.g., a silicon oxide film) 143 is buried. The insulating film 143 deposited on the upper surface of the substrate 110 is removed by, for example, a CMP method. The upper surface of the substrate 110 and the upper surfaces of the films in the trenches 111 are planarized.

Portions adjacent to the sidewalls of the trenches 111 in the substrate 110 become the semiconductor films (the first films) 120. Stacked films 151 are formed in which the films to be the floating gates FG are sandwiched in the X-direction between the semiconductor films (the first films) 120 and the control gates (the second films) CG via the insulating films 141 and 142.

Figure 17:
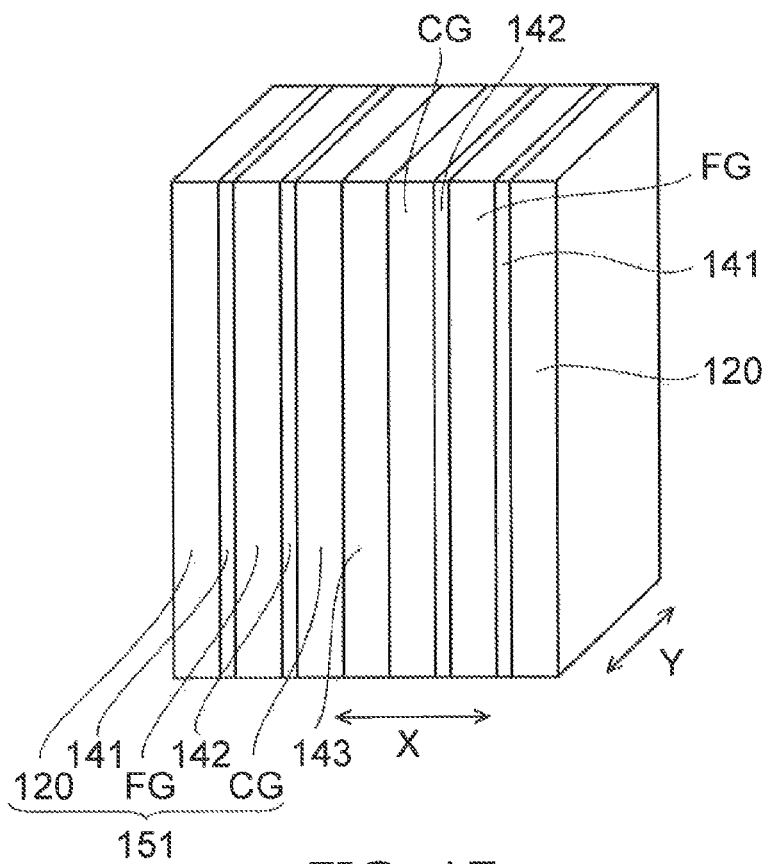

FIG. 17 is an enlarged view extracting and showing a broken line part in FIG. 16.

In one trench 111 the stacked films 151 are symmetrically formed in the X-direction across the insulating film 143. At this point, the semiconductor films 120, the insulating films 141 and 142, the films to be the floating gates FG, and the control gates CG are formed in a tabular shape spreading along the Y-direction.

Thereafter, the stacked films 151 are etched in a direction parallel to a Y-Z plane and inclined with respect to the major surface of the substrate 110 (the upper surfaces of the stacked films 151).

Figure 18:
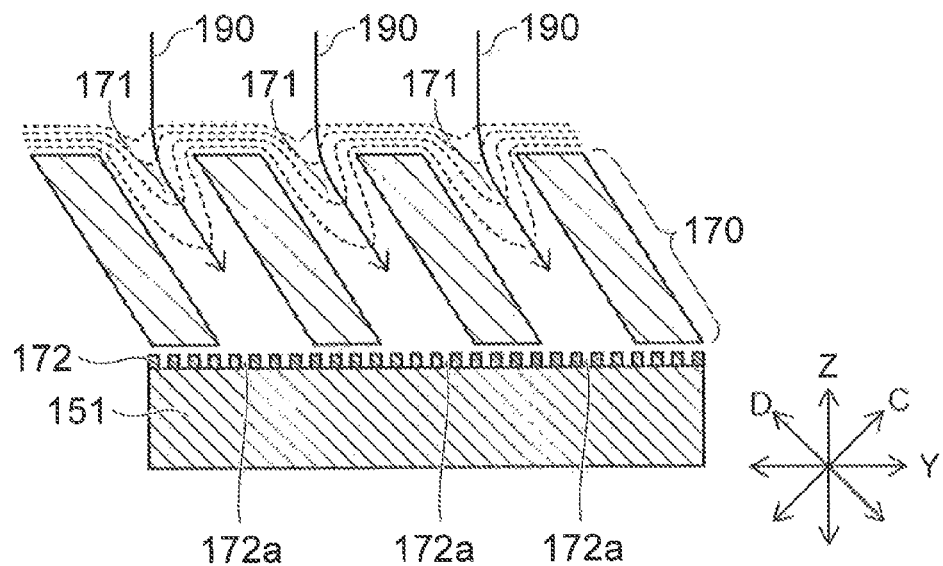

In this oblique etching, as in the first embodiment, as shown in FIG. 18, an electric field control body 170 is used.

A mask layer 172 is formed on the upper surface of the stacked film 151. A plurality of openings 172a are selectively formed in the mask layer 172.

Figure 19A:
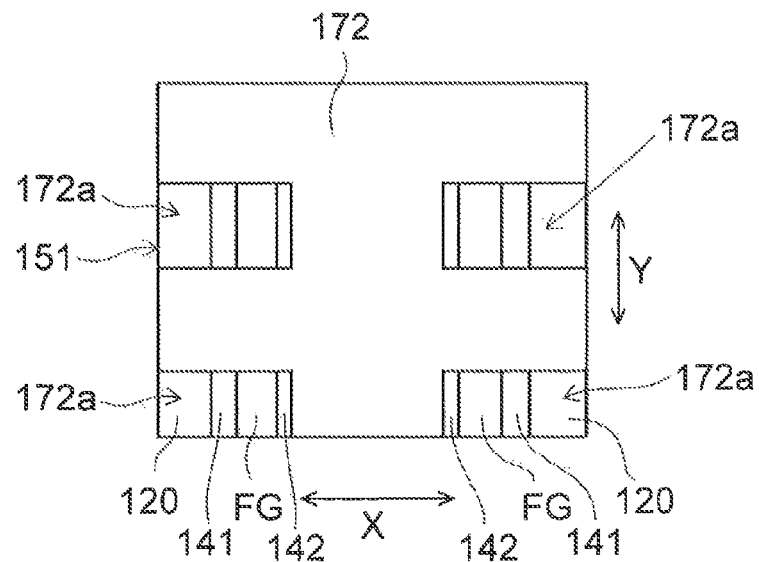

FIG. 19A is a schematic top view of the stacked film 151 and the mask layer 172.

Figure 19B:
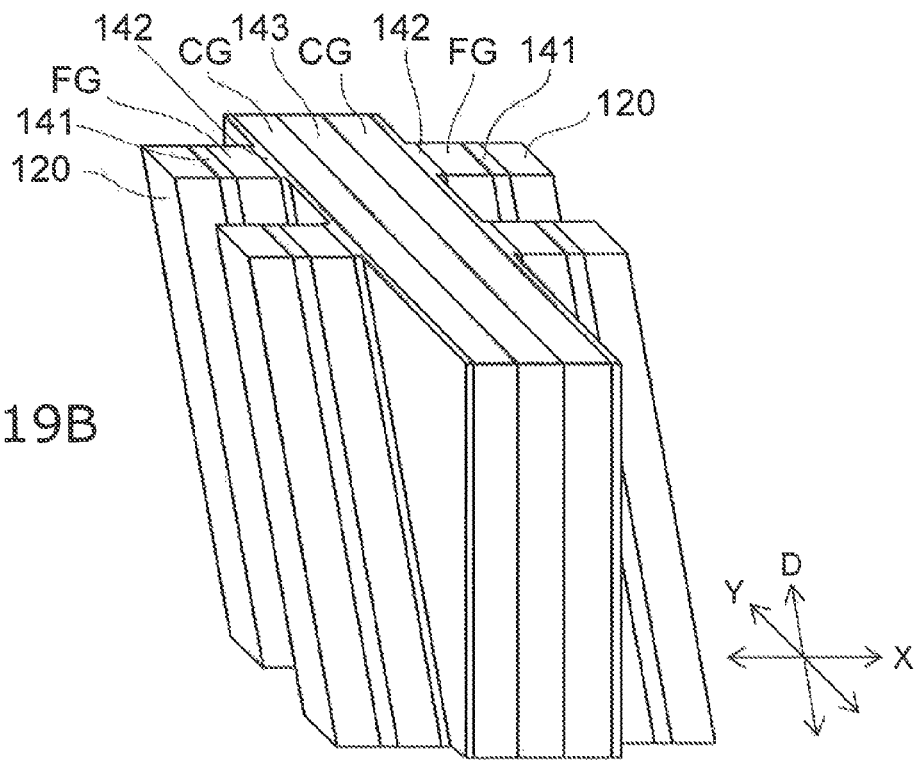

The mask layer 172 covers all the control gates CG and all the insulating films 143 in a cell region where the memory cells 200 are disposed. The semiconductor film 120, the insulating films 141 and 142, and the film to be the floating gates FG are selectively exposed from the openings 172a. The semiconductor film 120, the insulating films 141 and 142, and the film to be the floating gates FG, which are selectively exposed, are etched in the D-direction inclined with respect to the upper surface of the stacked film 151. The semiconductor film 120, the insulating films 141 and 142, and the film to be the floating gates FG are etched in the D-direction from the upper surface side of the stacked film 151 toward the bottom of the trench 111. The semiconductor film 120 and the film to be the floating gates FG are etched by the RIE, which is anisotropic dry etching. A plurality of trenches 152 extending in the D-direction are formed as shown in FIG. 21A. The semiconductor film 120 and the film to be the floating gates FG are processed into a line shape extending in the D-direction as shown in FIGS. 19B and 21A.

A wafer including the substrate 110 and the stacked films 151 is supported on a lower electrode in an etching chamber. Plasma is generated in the chamber. Ions in the plasma accelerate toward the wafer with bias potential applied to the wafer side via the lower electrode.

On the wafer surface, as shown in FIG. 18, the electric field control body 17 is disposed contiguous to the mask layer 172. The electric filed control body 170 is a metal body Including the plurality of slits 171. The slits 171 are inclined along the D-direction and pierce through the electric field control body 170. The mask layer 172 is located between the wafer and the electric field control body 170.

In order to prevent contamination in the chamber due to metal, it is desired to cover the surface of the electric filed control body 170 of the metal body with an insulating film. Alternatively, the electric field control body 170 may be formed of conductive silicon sufficiently containing impurities such as phosphorus.

An equipotential surface represented by a broken line in FIG. 18 is formed in the slits 171 by the electric field control body 170 including the slits 171 inclined along the D-direction. Therefore, ion tracks 190 are bent in the D-direction from the direction perpendicular to the wafer surface near the openings of the slits 171. Therefore, the ions accelerated in the D-direction are made incident on the stacked film 151.

A region covered with the electric field control body 170 during the etching shown in FIG. 18 is exposed under the slits 171 and etched by moving the electric field control body 170 in, for example, the Y-direction.

The ions, the incidence direction of which is controlled by the electric field control body 170, are made incident on the surface of the stacked film 151 exposed in the openings 172a of the mask layer 172. The etching of the stacked film 151 proceeds in the D-direction. Note that the mask layer 172 may be a multilayer mask as in the first embodiment.

The plurality of semiconductor films 120 having a line shape extending in the D-direction are formed by the etching in the D-direction. At this point, the film to be the floating gates FG is also formed in a line shape extending in the D-direction.

Subsequently, second oblique etching is applied to the stacked film 151. In this case, as in the first oblique etching, the RIE method is applied using the electric field control body 170.

By rotating the electric field control body 170 around a Z axis perpendicular to the upper surface of the stacked film 151 from the state shown in FIG. 18, the slits 171 of the electric field control body 170 can be inclined in the C-direction orthogonal to the D-direction.

Figure 20A:
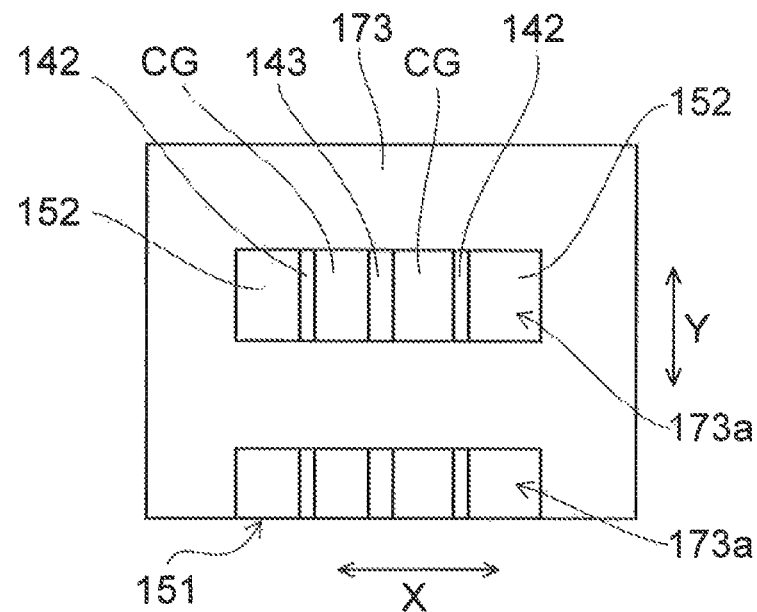
Figure 20B:
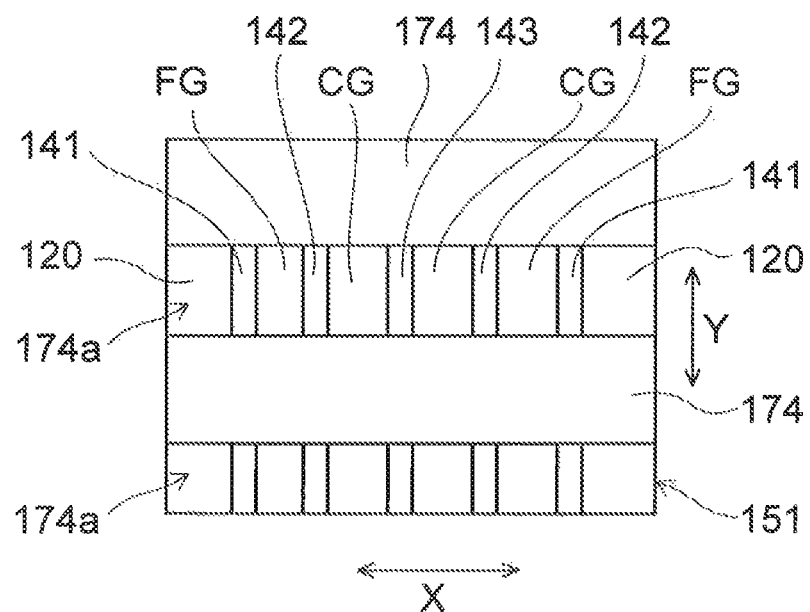

On the stacked film 151, a mask layer 173 is formed as shown in FIG. 20A. A plurality of openings 173a are formed in the mask layer 173. The electric field control body 170 is disposed contiguous to the mask layer 173. The ions accelerated in the C-direction by the electric field control body 170 are made incident on the surface of the stacked film 151 exposed to the openings 173a. Etching in the C-direction of the stacked film 151 proceeds.

The mask layer 173 covers all the semiconductor films 120 in the cell region. The control gate CG and the insulating films 142 and 143 are selectively exposed from the openings 173a. Among the trenches 152 formed by first etching, the upper ends of the trenches 152 corresponding to the portion where the film to be the floating gates FG is removed are selectively exposed from the openings 173a without being covered with the mask layer 173.

The stacked film 151 is etched in the C-direction inclined with respect to the upper surface of the stacked film 151 and orthogonal to the D-direction using the mask layer 173 and the electric field control body 170.

A portion not covered with the mask layer 173 in the stacked film 151 is etched in the C-direction from the upper surface side of the stacked film 151 toward the bottom of the trench 111. As shown in FIG. 21B, the control gates CG are processed into a line shape extending in the C-direction.

The film to be the floating gates FG processed into the line shape extending in the D-direction by the first oblique etching is processed into island shapes remaining in crossing sections of the semiconductor film 120 having the line shape and the control gates CG having the line shape by the second oblique etching along the C-direction orthogonal to the D-direction and becomes the floating gates FG.

Of the second embodiment, after the films are formed in the trenches 111 formed in the substrate 110, it is possible to collectively form the three-dimensionally disposed plurality of memory cells 200 by performing the oblique etching twice. A process for repeatedly stacking and forming the semiconductor films 120, the films to be the floating gates FG, the control gates CG, and the like on the substrate 110 is unnecessary. It is possible to considerably reduce the number of processes and costs.

The upper end portions of the semiconductor films 120 and the upper end portions of the control gates CG exposed on the upper surface sides of the stacked films 151 can be directly used as the contact sections for connection to upper layer interconnects for external connection. Therefore, stepwise processing for contact is unnecessary for the stacked films 151.

Note that, after the etching for processing the control gate CG and the films to be the floating gates FG in a line shape is performed first, the etching for processing the semiconductor films 120 in a line shape and processing the films to be the floating gates FG in island shapes may be performed.

The lithography process for patterning a mask layer can be performed only once by using separate materials for the semiconductor films 120 and the control gates CG and giving an etching selection ratio to the semiconductor films 120 and the control gates CG. For example, the mask layer 174 shown in FIG. 20B can be used in common for the second oblique etching.

Portions where the upper surfaces of the stacked films 151 are covered with the mask layer 174 and portions where the upper surfaces of the stacked films 151 are not covered with the mask layer 174 and exposed from openings 174a are alternately disposed in the Y-direction.

For example, the semiconductor films 120 and the films to be the floating gates FG exposed from the openings 174a by the first etching are obliquely etched in the D-direction. The control gates CG having etching resistance against conditions in this case are not etched.

Subsequently, in the second etching, the control gates CG are obliquely etched in the C-direction and the films to be the floating gates FG are processed into island shapes. The semiconductor films 120 having etching resistance against conditions in this case are not etched.

The order of the etching of the semiconductor films 120 and the control gates CG may be opposite.

Of the second embodiment, the stacked films 151 are formed on the sidewalls of the trenches 111. Therefore, by setting the depth of the trenches 111 larger and setting the pitches among the plurality of trenches 111 narrower, it is possible to increase the number per unit volume of the memory cells 200 including the stacked films 151 and reduce bit costs.

In the process for, after forming the memory holes MH, filling the memory films 30 and the channel bodies 20 back in the memory holes MH as in the first embodiment, it is difficult to divide the charge storage film 32 among the electrode films WL in the different layers. In this case, if a conductive film or a semiconductive film in which charges can freely move is used as the charge storage film 32, movement of retained charges easily occurs among memory cells in different layers. Therefore, a charge trap system that makes use of trap sites in an insulating film is desired for the charge storage film 32.

On the other hand, in the second embodiment, it is possible to divide the charge retaining portions (the floating gates FG) among the crossing sections of the semiconductor films 120 and the control gates CG by performing the oblique etching twice. Therefore, it is possible to select a floating system more excellent in charge storage efficiency than the charge trap system. Therefore, reliability of charge retention is improved. A margin of ON/OFF potential can be secured. As a result, it is possible to reduce process difficulty. Further, it is easy to cope with multi-valued cells.

Third Embodiment

Figure 22:
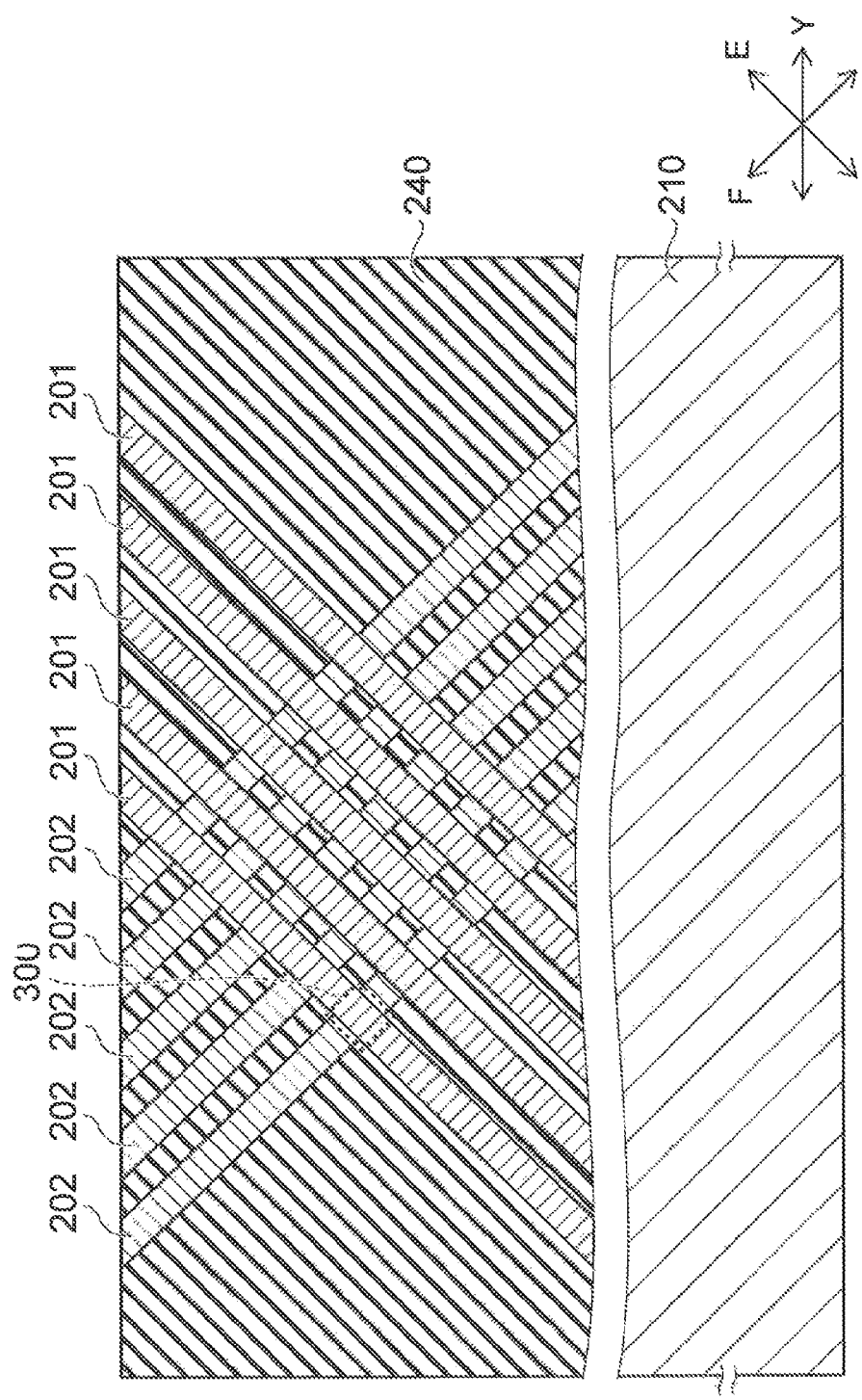
FIG. 22 is a schematic sectional view of a semiconductor memory device of a third embodiment.

FIG. 22 is a schematic sectional view of a semiconductor memory device of a third embodiment.

The semiconductor memory device of the third embodiment includes a substrate 210 and a plurality of memory cells 300 provided above the substrate 210.

Figure 23:
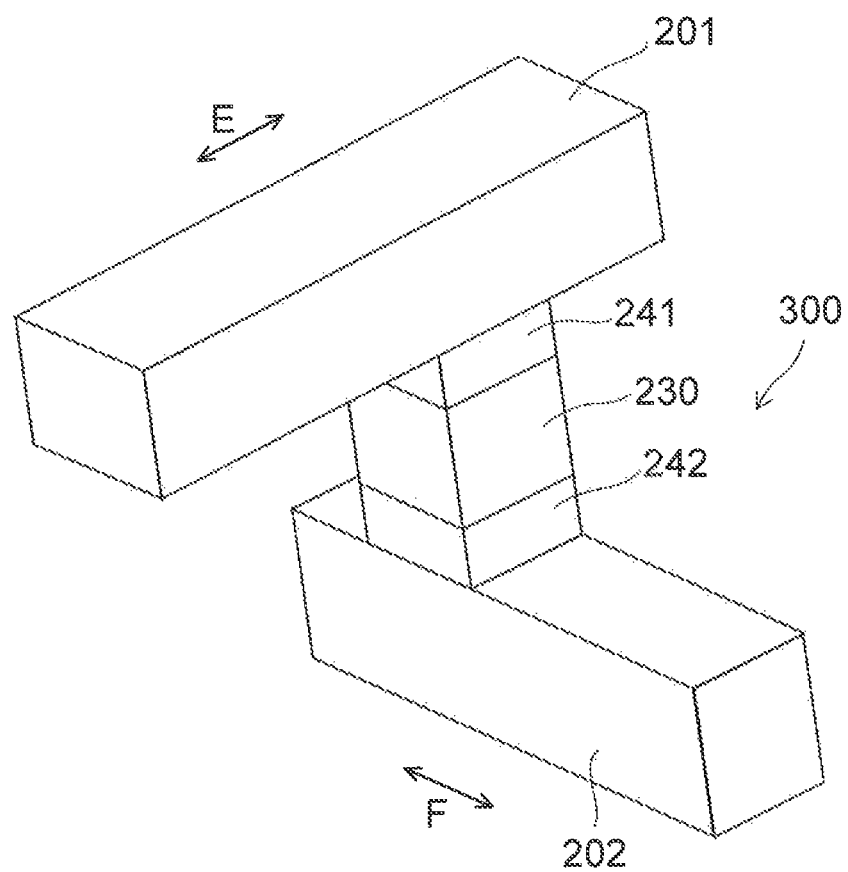
FIG. 23 is a schematic perspective view of a memory cell of the third embodiment.

FIG. 23 is an enlarged schematic sectional view of the memory cell 300.

On the substrate 210, bit lines 202 functioning as a plurality of first films having conductivity and word lines 201 functioning as a plurality of second films having conductivity are provided to cross each other. The memory cells 300 are provided in crossing sections of the bit lines 202 and the word lines 201.

In FIG. 22, a direction parallel to a major surface of the substrate 210 is represented as a Y-directio.

The bit lines 202 extend in a line shape toward the substrate 210 side in a direction (in FIG. 22, an F-direction) inclined with respect to the major surface of the substrate 210. The bit lines 202 are semiconductor films, metal films, or metal compound films.

The word lines 201 extend in a line shape toward the substrate 210 side in a direction inclined with respect to the major surface of the substrate 210, which is a direction (in FIG. 22, an E-direction) crossing the direction in which the bit lines 202 extend. For example, the bit lines 202 and the word lines 201 are orthogonal to each other in a plane perpendicular to the major surface of the substrate 210. The word lines 201 are semiconductor films, metal films, or metal compound films.

An insulating film 240 is provided on the substrate 210. The bit lines 202 and the word lines 201 are insulated from each other by the insulating film 240.

In a crossing section of the bit line 202 and the word line 201, as shown in FIG. 23, a variable resistance film 230 is provided as a storage film. The variable resistance film 230 includes, for example, metal oxide. The variable resistance film 230 is capable of electrically switching a state in which resistance is relatively low (a set state) and a state in which resistance is high (a reset state) and stores data in a nonvolatile manner.

An electrode film 242 is provided between the bit line 202 and the variable resistance film 230. An electrode film 241 is provided between the word line 201 and the variable resistance film 230. An insulating film is provided around the variable resistance film 230. The variable resistance film 230 is separated in the E-direction and the F-direction.

When a reset voltage is applied to the variable resistance film 230 in a low resistance state in which resistance is relatively low (the set state) through the bit line 202 and the word line 201 that sandwich the variable resistance film 230 of a control target memory cell 300, the variable resistance film 230 can switch to a high resistance state in which resistance is relatively high (the reset state). When a set voltage higher than the reset voltage is applied to the variable resistance film 230 in the high resistance state (the reset state), the variable resistance film 230 can switch to the low resistance state (the set state).

The plurality of memory cells 300 are three-dimensionally provided in the E-direction, the F-direction, and the paper surface depth direction in FIG. 22.

The plurality of bit lines 202 are stacked in the E-direction. The upper end portion on the opposite side of the lower end portion on the substrate 210 side of each of the bit lines 202 can be exposed above the substrate 210. Therefore, a contact section for connecting each of the bit lines 202 to the outside can be provided in the upper end portion of each of the bit lines 202. In connecting each of the bit lines 202 to the contact section, a part of the stacked structure of the plurality of bit lines 202 does not have to be processed into, for example, a step shape.

The plurality of word lines 201 are stacked in the F-direction. The upper end portion on the opposite side of the lower end portion on the substrate 210 side of each of the word lines 201 can be exposed above the substrate 210. Therefore, a contact section for connecting each of the word lines 201 to the outside can be provided in the upper end portion of each of the word lines 201. In connecting each of the word lines 201 to the contact section, a part of the stacked structure of the plurality of word lines 201 does not have to be processed into, for example, a step shape.

A method for manufacturing the semiconductor memory device of the third embodiment is described with reference to FIGS. 24 to 29B.

Figure 24:
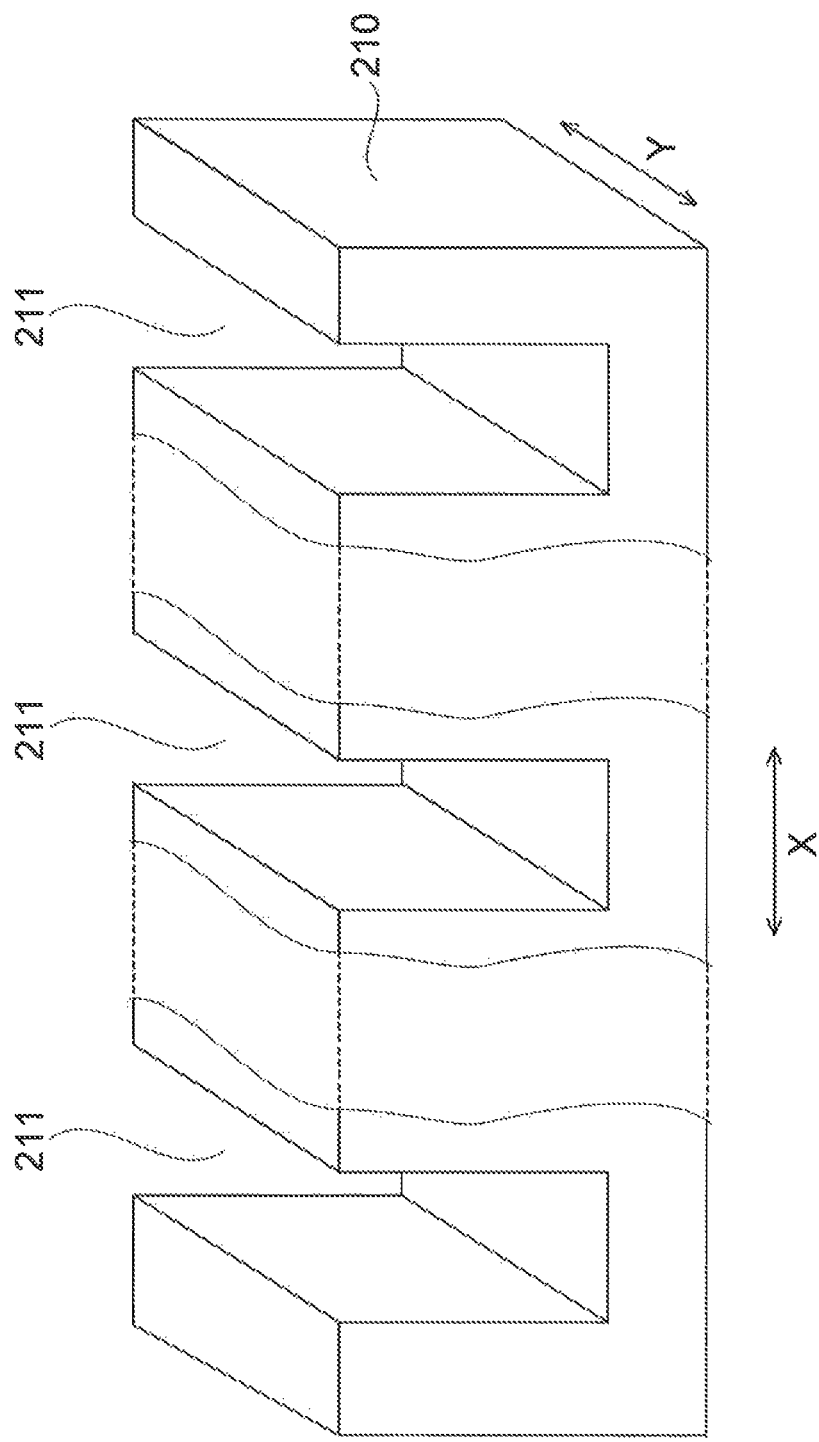

As shown in FIG. 24, a plurality of trenches 211 are formed in, for example, the substrate 210 functioning as a first film. A Y-direction shown in FIG. 24 corresponds to the Y-direction shown in FIG. 22. In FIG. 24, an X-direction is orthogonal to the Y-direction in a plane parallel to the major surface of the substrate 210. The plurality of trenches 211 are arrayed in the X-direction. Each of the trenches 211 extends in the Y-direction.

The substrate 210 is, for example, a silicon substrate. The trenches 211 are directly formed on the substrate 210 as the first film. Alternatively, a conductive film may be separately formed on the substrate 210 as the first film. The trenches 211 may be formed in the conductive film.

Portions adjacent to the sidewalk of the trenches 211 in the substrate 210 become the bit lines 202 as described below. Therefore, in terms of process integration, it is desired to form the trenches 211 in the substrate 210.

Figure 25:
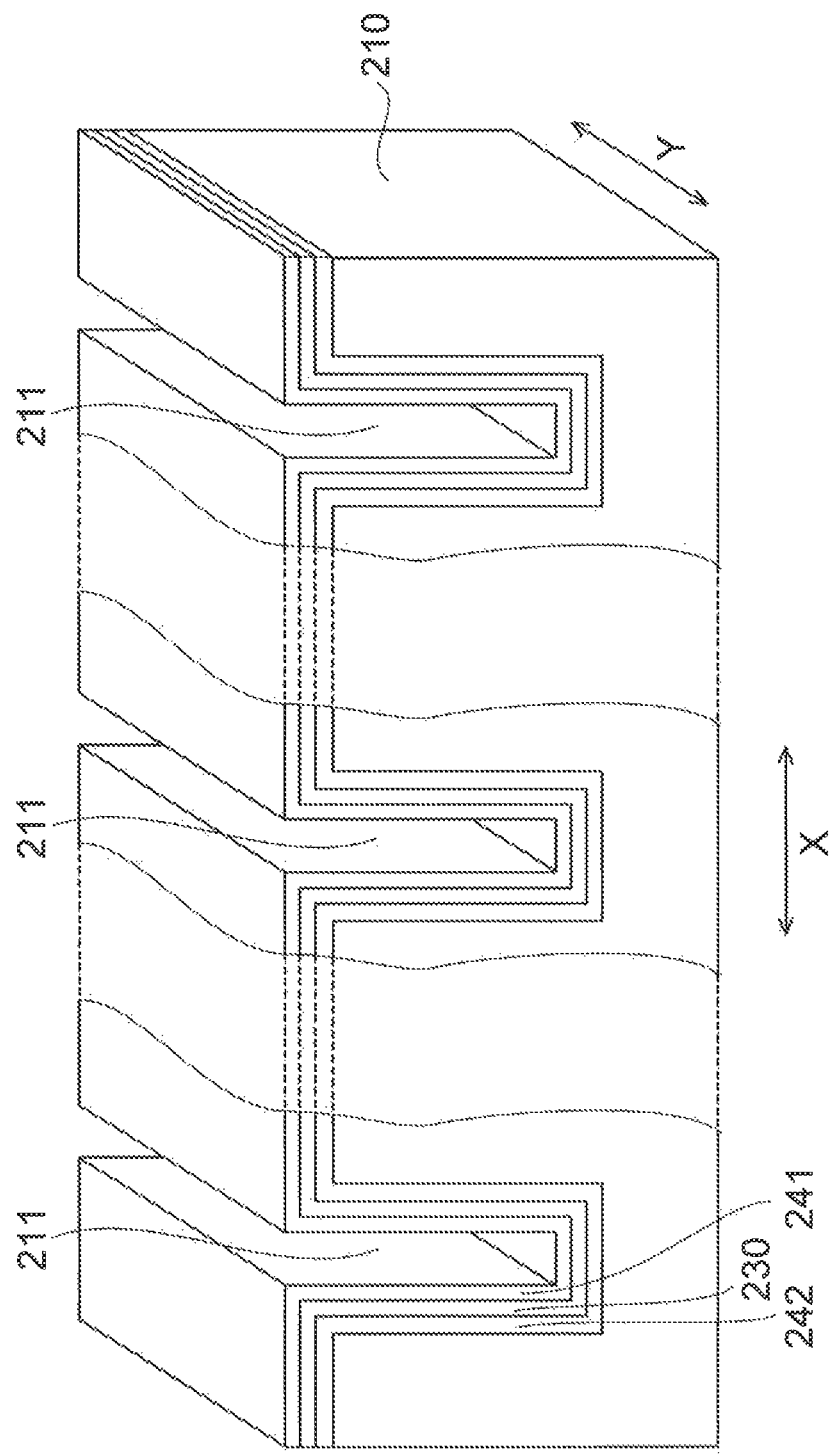

Subsequently, in the trenches 211, as shown in FIG. 25, the electrode film 242, the variable resistance film 230, and the electrode film 241 are formed in order. The electrode film 242, the variable resistance film 230, and the electrode film 241 are conformally formed on the sidewalls and the bottoms of the trenches 211. The electrode film 242, the variable resistance film 230, and the electrode film 241 are stacked in order from the side wall sides of the trenches 211. Hollows remain in the centers in the width direction of the trenches 211 (the X-direction).

Subsequently, the electrode film 241, the variable resistance film 230, and the electrode film 242 are etched back by, for example, the RIE method. The films on the substrate 210 retract in the depth direction of the trenches 211.

Figure 26:
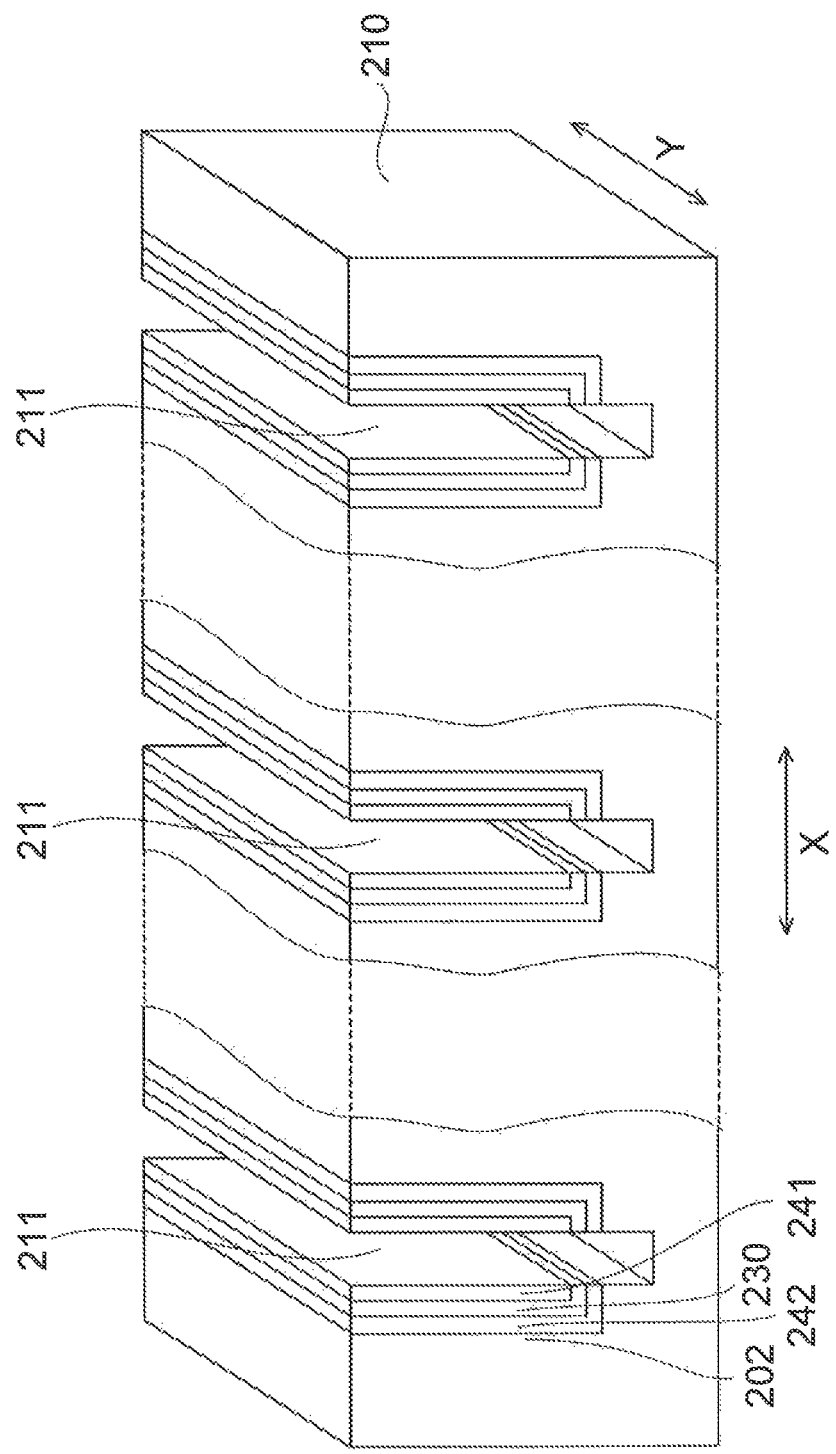

Consequently, the films deposited on the substrate 210 are removed. As shown in FIG. 26, the upper surface of the substrate 210 is exposed. Further, the films deposited on the bottoms of the trenches 211 are divided in the width direction of the trenches 211 (the X-direction). By appropriately setting conditions (a gas type, etc.) during the RIE, it is possible to advance anisotropic etching in the depth direction of the trenches 211 while protecting, with the films deposited during the RIE, the electrode film 241 on the innermost side among the films formed along the sidewalls of the trenches 211. Alternatively, after the electrode film 241 is deposited, it is possible to protect the electrode film 241 from the RIE by conformally depositing, in the trenches 211, a sacrificial film (e.g., a silicon oxide film or a silicon nitride film) that protects the sidewall of the electrode film 241.

Figure 27:
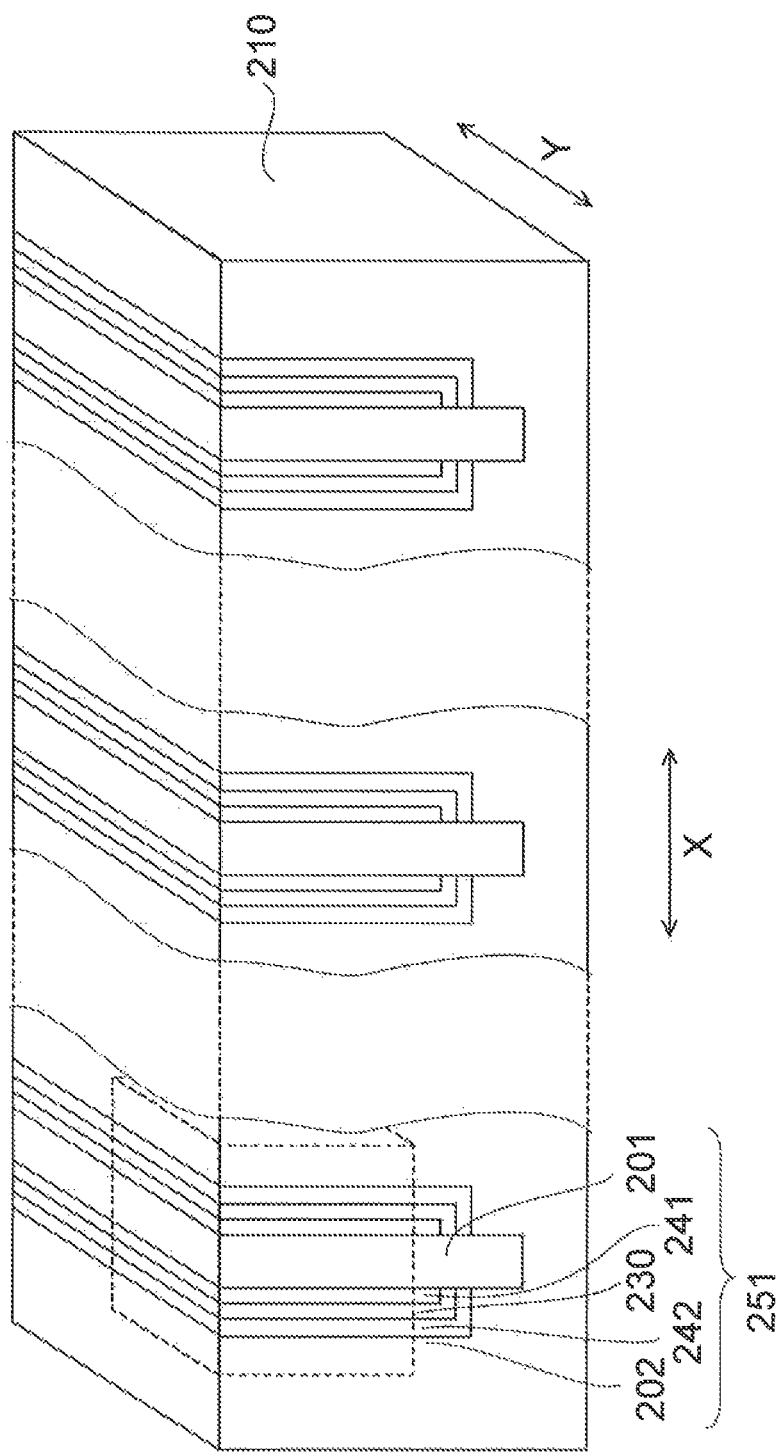

In the hollows remaining on the inner side of the electrode film 241, as shown in FIG. 27, the word lines 201 are buried. The word lines 201 deposited on the upper surface of the substrate 210 are removed by, for example, the CMP method. The upper surface of the substrate 210 and the upper surfaces of the films in the trenches 211 are planarized.

Portions adjacent to the sidewalls of the trenches 211 in the substrate 210 become the bit lines 202. Stacked films 251 are formed in which the variable resistance films 230 are sandwiched in the X-direction between the bit lines 202 and the word lines 201 via the electrode films 241 and 242.

Figure 28:
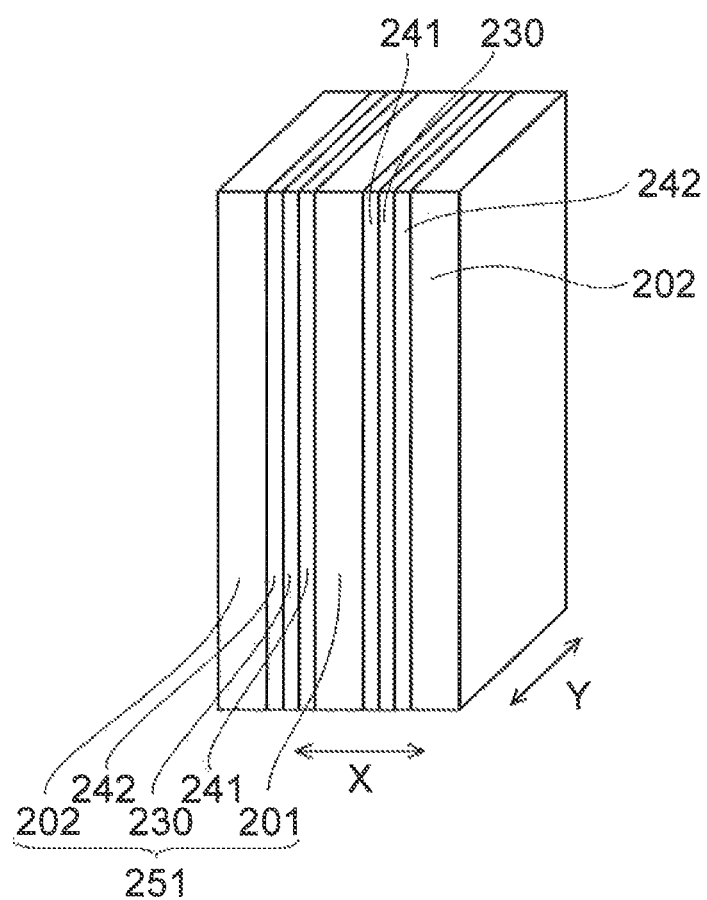

FIG. 28 is an enlarged view extracting and showing a broken line part in FIG. 27.

At this point, the bit line 202, the electrode films 241 and 242, and the word line 201 are formed in a tabular shape spreading along the Y-direction.

Thereafter, the stacked film 251 is etched in a direction inclined with respect to the major surface of the substrate 210 (the upper surface of the stacked film 251).

In this oblique etching, as in the first and second embodiments, an electric field control body is used. A mask layer is formed on the upper surface of the stacked film 251. A plurality of openings are selectively formed in the mask layer.

For example, first, a first mask layer covers all the word lines 201 in a cell region where the memory cells 300 are disposed. The bit lines 202 and the variable resistance film 230 are selectively exposed from the openings of the first mask layer. The bit lines 202 and the variable resistance film 230, which are selectively exposed, are etched in the F-direction inclined with respect to the upper surface of the stacked film 251. The bit lines 202 and the variable resistance film 230 are etched in the F-direction from the upper surface side of the stacked film 251 toward the bottom of the trench 211. The bit lines 202 and the variable resistance film 230 are etched by the RIE, which is anisotropic dry etching. A plurality of trenches 252 extending in the F-direction are formed as shown in FIG. 29A. The bit lines 202 and the variable resistance film 230 are processed into a line shape extending in the F-direction.

A wafer including the substrate 210 and the stacked films 251 is supported on a lower electrode in an etching chamber. Plasma is generated in the chamber. Ions in the plasma accelerate toward the wafer with bias potential applied to the wafer side via the lower electrode.

On the wafer surface, as in the second embodiment, an electric field control body is disposed contiguous to the first mask layer. The electric filed control body is a metal body including a plurality of slits. The slits are inclined along the F-direction and pierce through the electric field control body. The first mask layer is located between the wafer and the electric field control body.

Ion tracks are bent in the F-direction from the direction perpendicular to the wafer surface near the openings of the slits by the electric field control body including the slits inclined along the F-direction. Therefore, the ions accelerated in the F-direction are made incident on the stacked film 251.

The ions, the incidence direction of which is controlled by the electric field control body, are made incident on the surface of the stacked film 251 exposed in the openings of the first mask layer. The etching of the stacked film 251 proceeds in the F-direction.

The plurality of bit lines 202 having a line shape extending in the F-direction are formed by the etching in the F-direction. At this point, the variable resistance film 230 is also formed in a line shape extending in the F-direction.

Subsequently, second oblique etching is applied to the stacked film 251. In this case, as in the first oblique etching, the RIE method is applied using the electric field control body and the second mask layer.

The second mask layer covers all the bit lines 202 in the cell region. The word lines 201 are selectively exposed from the openings of the second mask layer. Among the trenches 252 formed by first etching, the upper ends of the trenches 252 corresponding to the portion where the variable resistance film 230 is removed are selectively exposed from the openings without being covered with the second mask layer.

The stacked film 251 is etched in the E-direction inclined with respect to the upper surface of the stacked film 251 and orthogonal to the F-direction using the second mask layer and the electric field control body.

A portion not covered with the second mask layer in the stacked film 251 is etched in the E-direction from the upper surface side of the stacked film 251 toward the bottom of the trench 211. As shown in FIG. 29B, the word lines 201 are processed into the line shape extending in the E-direction.

The variable resistance film 230 processed into the line shape extending in the F-direction by the first oblique etching is processed into island shapes remaining in crossing sections of the bit line 202 having the line shape and the word line 201 having the line shape by the second oblique etching along the E-direction orthogonal to the F-direction.

Of the third embodiment, after the films are formed in the trenches 211 formed in the substrate 210, it is possible to collectively form the three-dimensionally disposed plurality of memory cells 300 by performing the oblique etching twice. A process for repeatedly stacking and forming the bit lines 202, the variable resistance films 230, the word lines 201, and the like on the substrate 210 is unnecessary. It is possible to considerably reduce the number of processes and costs.

The upper end portions of the bit lines 202 and the upper end portions of the word lines 201 exposed on the upper surface sides of the stacked films 251 can be directly used as the contact sections for connection to upper layer interconnects for external connection. Therefore, stepwise processing for contact is unnecessary for the stacked films 251.

Note that, after the etching for processing the word lines 201 and the variable resistance films 230 in a line shape is performed first, the etching for processing the bit lines 202 in a line shape and processing the variable resistance films 230 in island shapes may be performed.

The lithography process for patterning a mask layer can be performed only once by using separate materials for the bit lines 202 and the word lines 201 and giving an etching selection ratio to the bit lines 202 and the word lines 201. That is, the mask layer can be used in common for the oblique etching twice.

Of the third embodiment, the stacked films 251 are formed on the sidewalls of the trenches 211. Therefore, by setting the depth of the trenches 211 larger and setting the pitches among the plurality of trenches 211 narrower, it is possible to increase the number per unit volume of the memory cells 300 including the stacked films 251 and reduce bit costs. An increase in the number of processes is not caused in order to reduce bit costs.

In the third embodiment, the bit lines 202 and the word lines 201 are interchangeable. That is, the elements represented by reference numeral 202 may be word lines and the elements represented by reference numeral 201 may be bit lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
    a substrate including a major surface;
    a plurality of first films having conductivity or semiconductivity, the first films being provided above the substrate and extending in a first direction inclined with respect to the major surface;
    a plurality of second films having conductivity, the second films being provided above the substrate and extending in a second direction inclined with respect to the major surface and crossing the first direction; and
    a plurality of storage films provided in crossing sections of the first films and the second films.

2. The device according to claim 1, wherein the first films pierce through layered second films.

3. The device according to claim 1, wherein
    a stacked body including a plurality of electrode films as the second films and a plurality of insulating films respectively provided among the electrode films is provided above the substrate,
    a plurality of semiconductor bodies as the first films extend in the first direction piercing through the stacked body, and
    the storage films include charge storage films provided between the electrode films and the semiconductor bodies.

4. The device according to claim 3, wherein
    the storage films extend continuously in the first direction, and
    a plurality of columnar sections including the storage films and the semiconductor bodies extend in the first direction piercing through the stacked body.

5. The device according to claim 4, wherein upper end portions opposite to lower end portions on the substrate side in the columnar sections project from the stacked body in a cell region.

6. The device according to claim 5, further comprising contact electrodes provided above the stacked body in a cell outer region on an outer side of the cell region, wherein upper end portions of the electrode films include contact portions connected to the contact electrodes in the cell outer region.

7. The device according to claim 3, further comprising:

a lower gate layer provided between the substrate and the stacked body; and an upper gate layer provided above the stacked body, wherein the semiconductor bodies are inclined with respect to the lower gate layer and the upper gate layer, and pierce through the lower gate layer and the upper gate layer.

8. The device according to claim 3, wherein n (n is an integer not less than 2) memory cells having a structure in which the electrode films surround the semiconductor bodies via the charge storage films are provided for each of the semiconductor bodies, and the electrode films are divided into a plurality of groups each including n electrode films, and the electrode films one each selected from each of the groups are collectively controlled at common potential.

9. The device according to claim 1, wherein the storage films are separated in the first direction and the second direction.

10. The device according to claim 9, wherein semiconductor films as the first films extend in a line shape in the first direction, control gates as the second films extend in a line shape in the second direction, and the storage films include floating gates provided in crossing sections of the semiconductor films and the control gates.

11. The device according to claim 9, wherein bit lines as the first films extend in the first direction, word lines as the second films extend in the second direction, and the storage films include variable resistance films provided in crossing sections of the bit lines and the word lines.

* * * * *